(12) United States Patent
Smayling et al.

(10) Patent No.: US 8,286,107 B2
(45) Date of Patent: Oct. 9, 2012

(54) METHODS AND SYSTEMS FOR PROCESS COMPENSATION TECHNIQUE ACCELERATION

(75) Inventors: Michael C. Smayling, Fremont, CA (US); Michael A. McAweeney, Belmont, CA (US); Scott T. Becker, Scotts Valley, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 784 days.

(21) Appl. No.: 12/340,406

(22) Filed: Dec. 19, 2008

(65) Prior Publication Data

US 2009/0100396 A1 Apr. 16, 2009

Related U.S. Application Data

(63) Continuation-in-part of application No. 12/033,807, filed on Feb. 19, 2008, now Pat. No. 7,979,829.

(60) Provisional application No. 60/890,819, filed on Feb. 20, 2007, provisional application No. 61/087,546, filed on Aug. 8, 2008.

(51) Int. Cl.
  *G06F 17/50* (2006.01)
(52) U.S. Cl. ........................................................ 716/53
(58) Field of Classification Search .................. 716/5, 53
  See application file for complete search history.

(56) References Cited

U.S. PATENT DOCUMENTS

| | | | |
|---|---|---|---|
| 4,197,555 A | 4/1980 | Uehara et al. | |
| 4,417,161 A | 11/1983 | Uya | |
| 4,424,460 A | 1/1984 | Best | |
| 4,682,202 A | 7/1987 | Tanizawa | |
| 5,097,422 A | 3/1992 | Corbin et al. | |
| 5,121,186 A | 6/1992 | Wong et al. | |
| 5,208,765 A | 5/1993 | Turnbull | |
| 5,224,057 A | 6/1993 | Igarashi | |
| 5,242,770 A | 9/1993 | Chen et al. | |
| 5,378,649 A | 1/1995 | Huang | |
| 5,471,403 A | 11/1995 | Fujimaga | |
| 5,497,334 A | 3/1996 | Russell et al. | |
| 5,497,337 A | 3/1996 | Ponnapalli et al. | |

(Continued)

FOREIGN PATENT DOCUMENTS

EP 1394858 3/2004

(Continued)

OTHER PUBLICATIONS

U.S. Appl. No. 60/625,342, filed May 25, 2006, Pileggi et al.

(Continued)

*Primary Examiner* — Jack Chiang
*Assistant Examiner* — Brandon Bowers
(74) *Attorney, Agent, or Firm* — Martine Penilla Group, LLP

(57) ABSTRACT

Selected cells in a semiconductor chip layout are replaced with corresponding PCT pre-processed cells. Each PCT pre-processed cell represents a particular selected cell having been previously subjected to a cell-level-PCT-processing operation so as to include PCT-based cell layout adjustments. Following replacement of the selected cells in the semiconductor chip layout with corresponding PCT pre-processed cells, a chip-wide PCT processing operation is performed on the semiconductor chip layout for a given chip level. The presence of the PCT pre-processed cells in the semiconductor chip layout serves to accelerate the chip-wide PCT processing of the semiconductor chip layout. The chip-wide PCT processed semiconductor layout for the given chip level is recorded on a persistent storage medium.

29 Claims, 10 Drawing Sheets

U.S. PATENT DOCUMENTS

| | | | |
|---|---|---|---|
| 5,545,904 A | 8/1996 | Orbach | |
| 5,581,098 A | 12/1996 | Chang | |
| 5,636,002 A | 6/1997 | Garofalo | |
| 5,682,323 A * | 10/1997 | Pasch et al. | 716/53 |
| 5,684,311 A | 11/1997 | Shaw | |
| 5,684,733 A | 11/1997 | Wu et al. | |
| 5,705,301 A | 1/1998 | Garza et al. | |
| 5,723,883 A | 3/1998 | Gheewalla | |
| 5,740,068 A | 4/1998 | Liebmann et al. | |
| 5,745,374 A | 4/1998 | Matsumoto | |
| 5,790,417 A | 8/1998 | Chao et al. | |
| 5,796,624 A | 8/1998 | Sridhar et al. | |
| 5,825,203 A | 10/1998 | Kusunoki et al. | |
| 5,838,594 A | 11/1998 | Kojima | |
| 5,841,663 A | 11/1998 | Sharma et al. | |
| 5,847,421 A | 12/1998 | Yamaguchi | |
| 5,852,562 A | 12/1998 | Shinomiya et al. | |
| 5,858,580 A | 1/1999 | Wang et al. | |
| 5,898,194 A | 4/1999 | Gheewala | |
| 5,900,340 A | 5/1999 | Reich et al. | |
| 5,908,827 A | 6/1999 | Sirna | |
| 5,923,059 A | 7/1999 | Gheewala | |
| 5,929,469 A | 7/1999 | Mimoto et al. | |
| 5,935,763 A | 8/1999 | Caterer et al. | |
| 5,973,507 A | 10/1999 | Yamazaki | |
| 5,977,305 A | 11/1999 | Wigler et al. | |
| 6,009,251 A | 12/1999 | Ho et al. | |
| 6,026,223 A | 2/2000 | Scepanovic et al. | |
| 6,037,617 A | 3/2000 | Kumagai | |
| 6,044,007 A | 3/2000 | Capodieci | |
| 6,063,132 A | 5/2000 | DeCamp et al. | |
| 6,084,437 A | 7/2000 | Sako | |
| 6,091,845 A | 7/2000 | Pierrat et al. | |
| 6,099,584 A | 8/2000 | Arnold et al. | |
| 6,100,025 A | 8/2000 | Wigler et al. | |
| 6,114,071 A | 9/2000 | Chen et al. | |
| 6,166,415 A | 12/2000 | Sakemi et al. | |
| 6,174,742 B1 | 1/2001 | Sudhindranath et al. | |
| 6,182,272 B1 | 1/2001 | Andreev et al. | |
| 6,194,104 B1 | 2/2001 | Hsu | |
| 6,194,252 B1 | 2/2001 | Yamaguchi | |
| 6,194,912 B1 | 2/2001 | Or-Bach | |
| 6,209,123 B1 | 3/2001 | Maziasz et al. | |
| 6,230,299 B1 | 5/2001 | McSherry et al. | |
| 6,232,173 B1 | 5/2001 | Hsu et al. | |
| 6,240,542 B1 | 5/2001 | Kapur | |
| 6,249,902 B1 | 6/2001 | Igusa et al. | |
| 6,255,600 B1 | 7/2001 | Schaper | |
| 6,262,487 B1 | 7/2001 | Igarashi et al. | |
| 6,269,472 B1 | 7/2001 | Garza et al. | |
| 6,275,973 B1 | 8/2001 | Wein | |
| 6,282,696 B1 | 8/2001 | Garza et al. | |
| 6,303,252 B1 | 10/2001 | Lin | |
| 6,331,733 B1 | 12/2001 | Or-Bach et al. | |
| 6,335,250 B1 | 1/2002 | Egi | |
| 6,338,972 B1 | 1/2002 | Sudhindranath et al. | |
| 6,356,112 B1 | 3/2002 | Tran et al. | |
| 6,370,679 B1 | 4/2002 | Chang et al. | |
| 6,378,110 B1 | 4/2002 | Ho | |
| 6,388,296 B1 | 5/2002 | Hsu | |
| 6,393,601 B1 | 5/2002 | Tanaka et al. | |
| 6,415,421 B2 | 7/2002 | Anderson et al. | |
| 6,416,907 B1 | 7/2002 | Winder et al. | |
| 6,421,820 B1 | 7/2002 | Mansfield et al. | |
| 6,425,112 B1 | 7/2002 | Bula et al. | |
| 6,425,117 B1 | 7/2002 | Pasch et al. | |
| 6,426,269 B1 | 7/2002 | Haffner et al. | |
| 6,436,805 B1 | 8/2002 | Trivedi | |
| 6,445,065 B1 | 9/2002 | Gheewala et al. | |
| 6,469,328 B2 | 10/2002 | Yanai et al. | |
| 6,470,489 B1 | 10/2002 | Chang et al. | |
| 6,476,493 B2 | 11/2002 | Or-Bach et al. | |
| 6,477,695 B1 | 11/2002 | Gandhi | |
| 6,480,989 B2 | 11/2002 | Chan et al. | |
| 6,492,066 B1 | 12/2002 | Capodieci et al. | |
| 6,496,965 B1 | 12/2002 | van Ginneken et al. | |
| 6,505,327 B2 | 1/2003 | Lin | |
| 6,505,328 B1 | 1/2003 | van Ginneken et al. | |
| 6,509,952 B1 | 1/2003 | Govil et al. | |
| 6,514,849 B1 | 2/2003 | Hui et al. | |
| 6,516,459 B1 | 2/2003 | Sahouria | |
| 6,523,156 B2 | 2/2003 | Cirit | |
| 6,525,350 B1 | 2/2003 | Kinoshita et al. | |
| 6,536,028 B1 | 3/2003 | Katsioulas et al. | |
| 6,543,039 B1 | 4/2003 | Watanabe | |
| 6,553,544 B2 | 4/2003 | Tanaka et al. | |
| 6,553,559 B2 | 4/2003 | Liebmann et al. | |
| 6,553,562 B2 | 4/2003 | Capodieci et al. | |
| 6,571,140 B1 | 5/2003 | Wewalaarachchi | |
| 6,571,379 B2 | 5/2003 | Takayama | |
| 6,578,190 B2 | 6/2003 | Ferguson et al. | |
| 6,588,005 B1 | 7/2003 | Kobayashi et al. | |
| 6,590,289 B2 | 7/2003 | Shively | |
| 6,591,207 B2 | 7/2003 | Naya et al. | |
| 6,609,235 B2 | 8/2003 | Ramaswamy et al. | |
| 6,610,607 B1 | 8/2003 | Armbrust et al. | |
| 6,617,621 B1 | 9/2003 | Gheewala et al. | |
| 6,620,561 B2 | 9/2003 | Winder et al. | |
| 6,633,182 B2 | 10/2003 | Pileggi et al. | |
| 6,635,935 B2 | 10/2003 | Makino | |
| 6,643,831 B2 | 11/2003 | Chang et al. | |
| 6,650,014 B2 | 11/2003 | Kariyazaki | |
| 6,661,041 B2 | 12/2003 | Keeth | |
| 6,662,350 B2 | 12/2003 | Fried et al. | |
| 6,673,638 B1 | 1/2004 | Bendik et al. | |
| 6,687,895 B2 | 2/2004 | Zhang | |
| 6,691,297 B1 | 2/2004 | Misaka et al. | |
| 6,700,405 B1 | 3/2004 | Hirairi | |
| 6,703,170 B1 | 3/2004 | Pindo | |
| 6,714,903 B1 | 3/2004 | Chu et al. | |
| 6,732,338 B2 | 5/2004 | Crouse et al. | |
| 6,737,199 B1 | 5/2004 | Hsieh | |
| 6,737,347 B1 | 5/2004 | Houston et al. | |
| 6,745,372 B2 | 6/2004 | Cote et al. | |
| 6,745,380 B2 | 6/2004 | Bodendorf et al. | |
| 6,749,972 B2 | 6/2004 | Yu | |
| 6,760,269 B2 | 7/2004 | Nakase et al. | |
| 6,765,245 B2 | 7/2004 | Bansal | |
| 6,777,138 B2 | 8/2004 | Pierrat et al. | |
| 6,777,146 B1 | 8/2004 | Samuels | |
| 6,789,244 B1 | 9/2004 | Dasasathyan et al. | |
| 6,789,246 B1 | 9/2004 | Mohan et al. | |
| 6,792,593 B2 * | 9/2004 | Takashima et al. | 716/53 |
| 6,794,914 B2 | 9/2004 | Sani et al. | |
| 6,795,952 B1 | 9/2004 | Stine et al. | |
| 6,795,953 B2 | 9/2004 | Bakarian et al. | |
| 6,807,663 B2 * | 10/2004 | Cote et al. | 716/53 |
| 6,819,136 B2 | 11/2004 | Or-Bach | |
| 6,826,738 B2 | 11/2004 | Cadouri | |
| 6,834,375 B1 | 12/2004 | Stine et al. | |
| 6,841,880 B2 | 1/2005 | Matsumoto et al. | |
| 6,850,854 B2 | 2/2005 | Naya et al. | |
| 6,854,096 B2 | 2/2005 | Eaton et al. | |
| 6,854,100 B1 | 2/2005 | Chuang et al. | |
| 6,877,144 B1 | 4/2005 | Rittman et al. | |
| 6,884,712 B2 | 4/2005 | Yelehanka et al. | |
| 6,898,770 B2 | 5/2005 | Boluki et al. | |
| 6,904,582 B1 | 6/2005 | Rittman et al. | |
| 6,918,104 B2 | 7/2005 | Pierrat et al. | |
| 6,920,079 B2 | 7/2005 | Shibayama | |
| 6,928,635 B2 | 8/2005 | Pramanik et al. | |
| 6,931,617 B2 | 8/2005 | Sanie et al. | |
| 6,953,956 B2 | 10/2005 | Or-Bach et al. | |
| 6,954,918 B2 | 10/2005 | Houston | |
| 6,957,402 B2 | 10/2005 | Templeton et al. | |
| 6,968,527 B2 | 11/2005 | Pierrat | |
| 6,978,436 B2 | 12/2005 | Cote et al. | |
| 6,978,437 B1 | 12/2005 | Rittman et al. | |
| 6,992,394 B2 | 1/2006 | Park | |
| 6,992,925 B2 | 1/2006 | Peng | |
| 6,993,741 B2 | 1/2006 | Liebmann et al. | |
| 6,994,939 B1 | 2/2006 | Ghandehari et al. | |
| 7,016,214 B2 | 3/2006 | Kawamata | |
| 7,028,285 B2 | 4/2006 | Cote et al. | |
| 7,041,568 B2 | 5/2006 | Goldbach et al. | |
| 7,052,972 B2 | 5/2006 | Sandhu et al. | |
| 7,063,920 B2 | 6/2006 | Baba-Ali | |

| Patent | Date | Inventor |
|---|---|---|
| 7,064,068 B2 | 6/2006 | Chou et al. |
| 7,065,731 B2 | 6/2006 | Jacques et al. |
| 7,079,989 B2 | 7/2006 | Wimer |
| 7,093,208 B2 | 8/2006 | Williams et al. |
| 7,093,228 B2 | 8/2006 | Andreev et al. |
| 7,103,870 B2 | 9/2006 | Misaka et al. |
| 7,105,871 B2 | 9/2006 | Or-Bach et al. |
| 7,107,551 B1 | 9/2006 | de Dood et al. |
| 7,115,343 B2 | 10/2006 | Gordon et al. |
| 7,115,920 B2 | 10/2006 | Bernstein et al. |
| 7,120,882 B2 | 10/2006 | Kotani et al. |
| 7,124,386 B2 | 10/2006 | Smith et al. |
| 7,132,203 B2 | 11/2006 | Pierrat |
| 7,137,092 B2 | 11/2006 | Maeda |
| 7,149,999 B2 | 12/2006 | Kahng et al. |
| 7,152,215 B2 | 12/2006 | Smith et al. |
| 7,155,685 B2 | 12/2006 | Mori et al. |
| 7,155,689 B2 | 12/2006 | Pierrat et al. |
| 7,159,197 B2 | 1/2007 | Falbo et al. |
| 7,174,520 B2 | 2/2007 | White et al. |
| 7,175,940 B2 | 2/2007 | Laidig et al. |
| 7,185,294 B2 | 2/2007 | Zhang |
| 7,188,322 B2 | 3/2007 | Cohn et al. |
| 7,194,712 B2 | 3/2007 | Wu |
| 7,200,835 B2 | 4/2007 | Zhang et al. |
| 7,202,517 B2 | 4/2007 | Dixit et al. |
| 7,219,326 B2 | 5/2007 | Reed et al. |
| 7,225,423 B2 | 5/2007 | Bhattacharya et al. |
| 7,227,183 B2 | 6/2007 | Donze et al. |
| 7,231,628 B2 | 6/2007 | Pack et al. |
| 7,235,424 B2 | 6/2007 | Chen et al. |
| 7,243,316 B2 | 7/2007 | White et al. |
| 7,252,909 B2 | 8/2007 | Shin et al. |
| 7,264,990 B2 | 9/2007 | Rueckes et al. |
| 7,278,118 B2 | 10/2007 | Pileggi et al. |
| 7,287,320 B2 | 10/2007 | Wang et al. |
| 7,294,534 B2 | 11/2007 | Iwaki |
| 7,302,651 B2 | 11/2007 | Allen et al. |
| 7,308,669 B2 | 12/2007 | Buehler et al. |
| 7,335,966 B2 | 2/2008 | Ihme et al. |
| 7,337,421 B2 | 2/2008 | Kamat |
| 7,338,896 B2 | 3/2008 | Vanhaelemeersch et al. |
| 7,346,885 B2 | 3/2008 | Semmler |
| 7,350,183 B2 | 3/2008 | Cui et al. |
| 7,353,492 B2 | 4/2008 | Gupta et al. |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,376,931 B2 | 5/2008 | Kokubun |
| 7,383,521 B2 | 6/2008 | Smith et al. |
| 7,397,260 B2 | 7/2008 | Chanda et al. |
| 7,400,627 B2 | 7/2008 | Wu et al. |
| 7,402,848 B2 | 7/2008 | Chang et al. |
| 7,404,173 B2 | 7/2008 | Wu et al. |
| 7,411,252 B2 | 8/2008 | Anderson et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,426,710 B2 | 9/2008 | Zhang et al. |
| 7,434,185 B2 | 10/2008 | Dooling et al. |
| 7,441,211 B1 | 10/2008 | Gupta et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,459,792 B2 | 12/2008 | Chen |
| 7,465,973 B2 | 12/2008 | Chang et al. |
| 7,466,607 B2 | 12/2008 | Hollis et al. |
| 7,480,880 B2 | 1/2009 | Visweswariah et al. |
| 7,480,891 B2 | 1/2009 | Sezginer |
| 7,484,197 B2 | 1/2009 | Allen et al. |
| 7,487,475 B1 | 2/2009 | Kriplani et al. |
| 7,506,300 B2 | 3/2009 | Sezginer et al. |
| 7,509,621 B2 | 3/2009 | Melvin, III |
| 7,509,622 B2 | 3/2009 | Sinha et al. |
| 7,512,921 B2 | 3/2009 | Shibuya |
| 7,514,959 B2 | 4/2009 | Or-Bach et al. |
| 7,523,429 B2 | 4/2009 | Kroyan et al. |
| 7,527,900 B2 | 5/2009 | Zhou et al. |
| 7,563,701 B2 | 7/2009 | Chang et al. |
| 7,568,174 B2 | 7/2009 | Sezginer et al. |
| 7,569,310 B2 | 8/2009 | Wallace et al. |
| 7,614,030 B2 | 11/2009 | Hsu |
| 7,632,610 B2 | 12/2009 | Wallace et al. |
| 7,665,051 B2 | 2/2010 | Ludwig et al. |
| 7,712,056 B2 | 5/2010 | White et al. |
| 7,755,110 B2 | 7/2010 | Gliese et al. |
| 7,770,144 B2 | 8/2010 | Dellinger |
| 7,802,219 B2 | 9/2010 | Tomar et al. |
| 7,825,437 B2 | 11/2010 | Pillarisetty et al. |
| 7,882,456 B2 | 2/2011 | Zach |
| 7,898,040 B2 | 3/2011 | Nawaz |
| 7,917,877 B2 | 3/2011 | Singh et al. |
| 7,923,266 B2 | 4/2011 | Thijs et al. |
| 7,923,337 B2 | 4/2011 | Chang et al. |
| 7,962,867 B2 | 6/2011 | White et al. |
| 7,964,267 B1 | 6/2011 | Lyons et al. |
| 7,971,160 B2 | 6/2011 | Osawa et al. |
| 7,992,122 B1 | 8/2011 | Burstein et al. |
| 7,994,583 B2 | 8/2011 | Inaba |
| 8,004,042 B2 | 8/2011 | Yang et al. |
| 2002/0015899 A1 | 2/2002 | Chen et al. |
| 2002/0166107 A1 | 11/2002 | Capodieci et al. |
| 2003/0042930 A1 | 3/2003 | Pileggi et al. |
| 2003/0046653 A1 | 3/2003 | Liu |
| 2003/0061592 A1 | 3/2003 | Agrawal et al. |
| 2003/0088839 A1 | 5/2003 | Watanabe |
| 2003/0088842 A1 | 5/2003 | Cirit |
| 2003/0106037 A1 | 6/2003 | Moniwa et al. |
| 2003/0145299 A1 | 7/2003 | Fried et al. |
| 2003/0229868 A1 | 12/2003 | White et al. |
| 2003/0229875 A1 | 12/2003 | Smith et al. |
| 2004/0049754 A1 | 3/2004 | Liao et al. |
| 2004/0063038 A1 | 4/2004 | Shin et al. |
| 2004/0115539 A1 | 6/2004 | Broeke et al. |
| 2004/0139412 A1 | 7/2004 | Ito et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0229135 A1 | 11/2004 | Wang et al. |
| 2004/0232444 A1 | 11/2004 | Shimizu |
| 2004/0243966 A1 | 12/2004 | Dellinger |
| 2005/0055828 A1 | 3/2005 | Wang et al. |
| 2005/0087806 A1 | 4/2005 | Hokazono |
| 2005/0093147 A1 | 5/2005 | Tu |
| 2005/0101112 A1 | 5/2005 | Rueckes et al. |
| 2005/0136340 A1 | 6/2005 | Baselmans et al. |
| 2005/0138598 A1 | 6/2005 | Kokubun |
| 2005/0185325 A1 | 8/2005 | Hur |
| 2005/0189614 A1 | 9/2005 | Ihme et al. |
| 2005/0196685 A1 | 9/2005 | Wang et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0268256 A1 | 12/2005 | Tsai et al. |
| 2006/0063334 A1 | 3/2006 | Donze et al. |
| 2006/0070018 A1 | 3/2006 | Semmler |
| 2006/0084261 A1 | 4/2006 | Iwaki |
| 2006/0101370 A1 | 5/2006 | Cui et al. |
| 2006/0112355 A1 | 5/2006 | Pileggi et al. |
| 2006/0113567 A1 | 6/2006 | Ohmori et al. |
| 2006/0121715 A1 | 6/2006 | Chang et al. |
| 2006/0125024 A1 | 6/2006 | Ishigaki |
| 2006/0131609 A1 | 6/2006 | Kinoshita et al. |
| 2006/0151810 A1 | 7/2006 | Ohshige |
| 2006/0158270 A1 | 7/2006 | Gibet et al. |
| 2006/0177744 A1 | 8/2006 | Bodendorf et al. |
| 2006/0181310 A1 | 8/2006 | Rhee |
| 2006/0197557 A1 | 9/2006 | Chung |
| 2006/0206854 A1 | 9/2006 | Barnes et al. |
| 2006/0223302 A1 | 10/2006 | Chang et al. |
| 2006/0248495 A1 | 11/2006 | Sezginer |
| 2007/0038973 A1 | 2/2007 | Li et al. |
| 2007/0074145 A1* | 3/2007 | Tanaka ............ 716/21 |
| 2007/0094634 A1 | 4/2007 | Seizginer et al. |
| 2007/0101305 A1 | 5/2007 | Smith et al. |
| 2007/0105023 A1 | 5/2007 | Zhou et al. |

| | | |
|---|---|---|
| 2007/0106971 A1 | 5/2007 | Lien et al. |
| 2007/0113216 A1* | 5/2007 | Zhang .................. 716/17 |
| 2007/0196958 A1 | 8/2007 | Bhattacharya et al. |
| 2007/0209029 A1 | 9/2007 | Ivonin et al. |
| 2007/0210391 A1 | 9/2007 | Becker et al. |
| 2007/0234252 A1 | 10/2007 | Visweswariah et al. |
| 2007/0256039 A1 | 11/2007 | White |
| 2007/0274140 A1 | 11/2007 | Joshi et al. |
| 2007/0290361 A1 | 12/2007 | Chen |
| 2007/0294652 A1 | 12/2007 | Bowen |
| 2008/0005712 A1 | 1/2008 | Charlebois et al. |
| 2008/0046846 A1 | 2/2008 | Chew et al. |
| 2008/0082952 A1 | 4/2008 | O'Brien |
| 2008/0098334 A1 | 4/2008 | Pileggi et al. |
| 2008/0099795 A1 | 5/2008 | Bernstein et al. |
| 2008/0127029 A1 | 5/2008 | Graur et al. |
| 2008/0134128 A1 | 6/2008 | Blatchford et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0216207 A1 | 9/2008 | Tsai |
| 2008/0276105 A1 | 11/2008 | Hoberman et al. |
| 2008/0283910 A1 | 11/2008 | Dreeskornfeld et al. |
| 2008/0308848 A1 | 12/2008 | Inaba |
| 2008/0315258 A1 | 12/2008 | Masuda et al. |
| 2009/0014811 A1 | 1/2009 | Becker et al. |
| 2009/0024974 A1 | 1/2009 | Yamada |
| 2009/0031261 A1 | 1/2009 | Smith et al. |
| 2009/0032898 A1 | 2/2009 | Becker et al. |
| 2009/0032967 A1 | 2/2009 | Becker et al. |
| 2009/0037864 A1 | 2/2009 | Becker et al. |
| 2009/0077524 A1 | 3/2009 | Nagamura |
| 2009/0085067 A1 | 4/2009 | Hayashi et al. |
| 2009/0101940 A1 | 4/2009 | Barrows et al. |
| 2009/0106714 A1 | 4/2009 | Culp et al. |
| 2009/0155990 A1 | 6/2009 | Yanagidaira et al. |
| 2009/0181314 A1 | 7/2009 | Shyu et al. |
| 2009/0228853 A1 | 9/2009 | Hong et al. |
| 2009/0280582 A1 | 11/2009 | Thijs et al. |
| 2009/0302372 A1 | 12/2009 | Chang et al. |
| 2010/0001321 A1 | 1/2010 | Becker et al. |
| 2010/0006897 A1 | 1/2010 | Becker et al. |
| 2010/0006898 A1 | 1/2010 | Becker et al. |
| 2010/0006899 A1 | 1/2010 | Becker et al. |
| 2010/0006900 A1 | 1/2010 | Becker et al. |
| 2010/0006901 A1 | 1/2010 | Becker et al. |
| 2010/0006902 A1 | 1/2010 | Becker et al. |
| 2010/0006903 A1 | 1/2010 | Becker et al. |
| 2010/0006947 A1 | 1/2010 | Becker et al. |
| 2010/0006948 A1 | 1/2010 | Becker et al. |
| 2010/0006950 A1 | 1/2010 | Becker et al. |
| 2010/0006951 A1 | 1/2010 | Becker et al. |
| 2010/0006986 A1 | 1/2010 | Becker et al. |
| 2010/0011327 A1 | 1/2010 | Becker et al. |
| 2010/0011328 A1 | 1/2010 | Becker et al. |
| 2010/0011329 A1 | 1/2010 | Becker et al. |
| 2010/0011330 A1 | 1/2010 | Becker et al. |
| 2010/0011331 A1 | 1/2010 | Becker et al. |
| 2010/0011332 A1 | 1/2010 | Becker et al. |
| 2010/0011333 A1 | 1/2010 | Becker et al. |
| 2010/0012981 A1 | 1/2010 | Becker et al. |
| 2010/0012982 A1 | 1/2010 | Becker et al. |
| 2010/0012983 A1 | 1/2010 | Becker et al. |
| 2010/0012984 A1 | 1/2010 | Becker et al. |
| 2010/0012985 A1 | 1/2010 | Becker et al. |
| 2010/0012986 A1 | 1/2010 | Becker et al. |
| 2010/0017766 A1 | 1/2010 | Becker et al. |
| 2010/0017767 A1 | 1/2010 | Becker et al. |
| 2010/0017768 A1 | 1/2010 | Becker et al. |
| 2010/0017769 A1 | 1/2010 | Becker et al. |
| 2010/0017770 A1 | 1/2010 | Becker et al. |
| 2010/0017771 A1 | 1/2010 | Becker et al. |
| 2010/0017772 A1 | 1/2010 | Becker et al. |
| 2010/0019280 A1 | 1/2010 | Becker et al. |
| 2010/0019281 A1 | 1/2010 | Becker et al. |
| 2010/0019282 A1 | 1/2010 | Becker et al. |
| 2010/0019283 A1 | 1/2010 | Becker et al. |
| 2010/0019284 A1 | 1/2010 | Becker et al. |
| 2010/0019285 A1 | 1/2010 | Becker et al. |
| 2010/0019286 A1 | 1/2010 | Becker et al. |
| 2010/0019287 A1 | 1/2010 | Becker et al. |
| 2010/0019288 A1 | 1/2010 | Becker et al. |
| 2010/0019308 A1 | 1/2010 | Chan et al. |
| 2010/0023906 A1 | 1/2010 | Becker et al. |
| 2010/0023907 A1 | 1/2010 | Becker et al. |
| 2010/0023908 A1 | 1/2010 | Becker et al. |
| 2010/0023911 A1 | 1/2010 | Becker et al. |
| 2010/0025731 A1 | 2/2010 | Becker et al. |
| 2010/0025732 A1 | 2/2010 | Becker et al. |
| 2010/0025733 A1 | 2/2010 | Becker et al. |
| 2010/0025734 A1 | 2/2010 | Becker et al. |
| 2010/0025735 A1 | 2/2010 | Becker et al. |
| 2010/0025736 A1 | 2/2010 | Becker et al. |
| 2010/0032722 A1 | 2/2010 | Becker et al. |
| 2010/0032723 A1 | 2/2010 | Becker et al. |
| 2010/0032724 A1 | 2/2010 | Becker et al. |
| 2010/0032726 A1 | 2/2010 | Becker et al. |
| 2010/0037194 A1 | 2/2010 | Becker et al. |
| 2010/0037195 A1 | 2/2010 | Becker et al. |
| 2010/0096671 A1 | 4/2010 | Becker et al. |
| 2010/0203689 A1 | 8/2010 | Bernstein et al. |
| 2010/0232212 A1 | 9/2010 | Anderson et al. |
| 2010/0264468 A1 | 10/2010 | Xu |
| 2011/0154281 A1 | 6/2011 | Zach |
| 2011/0207298 A1 | 8/2011 | Anderson et al. |
| 2011/0260253 A1 | 10/2011 | Inaba |
| 2012/0012932 A1 | 1/2012 | Perng et al. |

FOREIGN PATENT DOCUMENTS

| | | |
|---|---|---|
| EP | 1670062 | 6/2006 |
| FR | 2860920 | 4/2005 |
| JP | 10-116911 | 5/1998 |
| JP | 2002-258463 | 9/2002 |
| KR | 10-1999-0057943 A | 7/1999 |
| KR | 10-2000-0028830 A | 5/2000 |
| KR | 10-2005-0030347 A | 3/2005 |
| WO | WO 2005/104356 | 11/2005 |
| WO | WO 2006/014849 | 2/2006 |
| WO | WO 2006/052738 | 5/2006 |
| WO | WO 2007/103587 | 9/2007 |

OTHER PUBLICATIONS

Acar, et al., "A Linear-Centric Simulation Framework for Parametric Fluctuations", 2002, IEEE, Carnegie Mellon University USA, pp. 1-8.

Amazawa, et al., "Fully Planarized Four-Level Interconnection with Stacked VLAS Using CMP of Selective CVD-Al and Insulator and its Application to Quarter Micron Gate Array LSIs", 1995, IEEE, Japan, pp. 473-476.

Axelrad et al. "Efficient Full-Chip Yield Analysis Methodology for OPC-Corrected VLSI Design", 2000, International Symposium on Quality Electronic Design (ISQED).

Balasinski et al. "Impact of Subwavelength CD Tolerance on Device Performance", 2002, SPIE.

Burkhardt, et al., "Dark Field Double Dipole Lithography (DDL) for Back-End-Of-Line Processes", 2007, SPIE Proceeding Series, vol. 6520; 65200K.

Capetti, et al., "Sub k1=0.25 Lithography with Double Patterning Technique for 45nm Technology Node Flash Memory Devices at λ=193nm", 2007, SPIE Proceeding Series, vol. 6520; 65202K.

Capodieci, L., et al., "Toward a Methodology for Manufacturability-Driven Design Rule Exploration," DAC 2004, Jun. 7-11, 2004, San Diego, CA.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Patterning with 0.93 NA", 2007, SPIE Proceeding Series, vol. 6520; 65202N.

Chow, et al., "The Design of a SRAM-Based Field-Programmable Gate Array—Part II: Circuit Design and Layout", 1999, IEEE, vol. 7 # 3 pp. 321-330.

Clark et al. "Managing Standby and Active Mode Leakage Power in Deep Sub-Micron Design", Aug. 9-11, 2004, ACM.
Cobb et al. "Using OPC to Optimize for Image Slope and Improve Process Window", 2003, SPIE.
Devgan "Leakage Issues in IC Design: Part 3", 2003, CCAD.
DeVor, et al., "Statistical Quality Design and Control", 1992, Macmillan Publishing Company, pp. 264-267.
Dictionary.com, "channel," in Collins English Dictionary—Complete & Unabridged 10th Edition. Source location: HarperCollins Publishers. http://dictionary.reference.com/browse/channel. Available: http://dictionary.reference.com.
Dusa, et al. "Pitch Doubling Through Dual Patterning Lithography Challenges in Integration and Litho Budgets", 2007, SPIE Proceeding Series, vol. 6520; 65200G.
El-Gamal, "Fast, Cheap and Under Control: The Next Implementation Fabric", Jun. 2-6, 2003, ACM Press, pp. 354-355.
Frankel, "Quantum State Control Interference Lithography and Trim Double Patterning for 32-16nm Lithography", 2007, SPIE Proceeding Series, vol. 6520; 65202L.
Garg, et al. "Lithography Driven Layout Design", 2005, IEEE.
Grobman et al. "Reticle Enhancement Technology Trends: Resource and Manufacturability Implications for the Implementation of Physical Designs" Apr. 1-4, 2001, ACM.
Grobman et al. "Reticle Enhancement Technology: Implications and Challenges for Physical Design" Jun. 18-22, 2001, ACM.
Gupta et al. "Enhanced Resist and Etch CD Control by Design Perturbation", Oct. 4-7, 2006, Society of Photo-Optical Instrumentation Engineers.
Gupta et al. "A Practical Transistor-Level Dual Threshold Voltage Assignment Methodology", 2005, Sixth International Symposium on Quality Electronic Design (ISQED).
Gupta et al. "Detailed Placement for Improved Depth of Focus and CD Control", 2005, ACM.
Gupta et al. "Joining the Design and Mask Flows for Better and Cheaper Masks", Oct. 14-17, 2004, Society of Photo-Optical Instrumentation Engineers.
Gupta et al. "Manufacturing-Aware Physical Design", 2003, ACM.
Gupta et al. "Selective Gate-Length Biasing for Cost-Effective Runtime Leakage Control", Jun. 7-11, 2004, ACM.
Gupta et al. "Wafer Topography-Aware Optical Proximity Correction for Better DOF Margin and CD Control", Apr. 13-15, 2005, SPIE.
Gupta, Puneet, et al., "Manufacturing-aware Design Methodology for Assist Feature Correctness," 2005.
Ha et al., "Reduction in the Mask Error Factor by Optimizing the Diffraction Order of a Scattering Bar in Lithography," Journal of the Korean Physical Society, vol. 46, No. 5, May 2005, pp. 1213-1217.
Halpin et al., "Detailed Placement with Net Length Constraints," Publication Year 2003, Proceedings of the 3rd IEEE International Workshop on System-on-Chip for Real-Time Applications, pp. 22-27.
Hayashida, et al., "Manufacturable Local Interconnect technology Fully Compatible with Titanium Salicide Process", Jun. 11-12, 1991, VMIC Conference.
Heng, et al., "A VLSI Artwork Legalization Technique Base on a New Criterion of Minimum Layout Perturbation", 1997, ACM Press, pp. 116-121.
Heng, et al., "Toward Through-Process Layout Quality Metrics", Mar. 3-4, 2005, Society of Photo-Optical Instrumentation Engineers.
Hu, et al., "Synthesis and Placement Flow for Gain-Based Programmable Regular Fabrics", Apr. 6-9, 2003, ACM Press, pp. 197-203.
Hur et al., "Mongrel: Hybrid Techniques for Standard Cell Placement," Publication Year 2000, IEEE/ACM International Conference on Computer Aided Design, ICCAD-2000, pp. 165-170.
Hutton, et al., "A Methodology for FPGA to Structured-ASIC Synthesis and Verification", 2006, EDAA, pp. 64-69.
Intel Core Microarchitecture White Paper "Introducing the 45 nm Next-Generation Intel Core Microarchitecture," 2007, Intel Corporation.
Jayakumar, et al., "A Metal and VIA Maskset Programmable VLSI Design Methodology using PLAs", 2004, IEEE, pp. 590-594.
Jhaveri, T. et al., Maximization of Layout Printability/Manufacturability by Extreme Layout Regularity, Proc. of the SPIE, Apr. 2006.

Kang, S.M., Metal-Metal Matrix (M3) for High-Speed MOS VLSI Layout, IEEE Trans. on CAD, vol. CAD-6, No. 5, Sep. 1987.
Kheterpal, et al., "Design Methodology for IC Manufacturability Based on Regular Logic-Bricks", DAC, Jun. 13-17, 2005, IEEE/AMC, vol. 6520.
Kheterpal, et al., "Routing Architecture Exploration for Regular Fabrics", DAC, Jun. 7-11, 2004, ACM Press, pp. 204-207.
Kim, et al., "Double Exposure Using 193nm Negative Tone Photoresist", 2007, SPIE Proceeding Series, vol. 6520; 65202M.
Kim, et al., "Issues and Challenges of Double Patterning Lithography in DRAM", 2007, SPIE; Proceeding Series, vol. 6520; 65200H.
Koorapaty, et al., "Exploring Logic Block Granularity for Regular Fabrics", 2004, IEEE, pp. 1-6.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2002, Springer-Verlag, vol. 2438 pp. 132-141.
Kuh et al., "Recent Advances in VLSI Layout," Publication Year 1990, Proceedings of the IEEE, vol. 78, Issue 2, pp. 237-263.
Lavin et al. "Backend DAC Flows for "Restrictive Design Rules"", 2004, IEEE.
Li, et al., "A Linear-Centric Modeling Approach to Harmonic Balance Analysis", 2002, IEEE, pp. 1-6.
Li, et al., "Nonlinear Distortion Analysis Via Linear-Centric Models", 2003, IEEE, pp. 897-903.
Liebmann et al., "Integrating DfM Components Into a Cohesive Design-To-Silicon Solution", IBM Systems and Technology Group, b IBM Research, pp. 1-12.
Liebmann et al., "Optimizing Style Options for Sub-Resolution Assist Features," Proc. of SPIE vol. 4346, 2001, pp. 141-152.
Liebmann, L. W., Layout Impact of Resolution Enhancement Techniques: Impediment or Opportunity?, International Symposium on Physical Design, 2003.
Liebmann, et al., "High-Performance Circuit Design for the RET-Enabled 65nm Technology Node", Feb. 26-27, 2004, SPIE Proceeding Series, vol. 5379 pp. 20-29.
Liu, et al., "Double Patterning with Multilayer Hard Mask Shrinkage for Sub-0.25 k1 Lithography", 200, SPIE Proceeding Series, vol. 6520; 65202J.
Mansfield et al., "Lithographic Comparison of Assist Feature Design Strategies," Proc. of SPIE; vol. 4000, 2000, pp. 63-76.
Miller, "Manufacturing-Aware Design Helps Boost IC Yield", Sep. 9, 2004, http://www.eetimes.com/showArticle.jhtml?articleID-47102054.
Mishra, P., et al., "FinFET Circuit Design," Nanoelectronic Circuit Design, pp. 23-54, 2011.
Mo, et al., "Checkerboard: A Regular Structure and its Synthesis, International Workshop on Logic and Synthesis", 2003, Department of Electrical Engineering and Computer Sciences, UC Berkeley, California, pp. 1-7.
Mo, et al., "PLA-Based Regular Structures and Their Synthesis", 2003, Department of Electrical Engineering and Computer Sciences, IEEE, pp. 723-729.
Mo, et al., "Regular Fabrics in Deep Sub-Micron Integrated-Circuit Design", 2004, Kluwer Academic Publishers, Entire Book.
Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.
Mutoh et al. "1-V Power Supply High-Speed Digital Circuit Technology with Multithreshold-Voltage CMOS", 1995, IEEE.
Op de Beek, et al., "Manufacturability issues with Double Patterning for 50nm half pitch damascene applications, using RELACS® shrink and corresponding OPC", 2007, SPIE Proceeding Series, vol. 6520; 65200I.
Or-Bach, "Programmable Circuit Fabrics", Sep. 18, 2001, e-ASIC, pp. 1-36.

Otten, et al., "Planning for Performance", DAC 1998, ACM Inc., pp. 122-127.
Pack et al. "Physical & Timing Verification of Subwavelength-Scale Designs—Part I: Lithography Impact on MOSFETs", 2003, SPIE.
Pandini, et al., "Congestion-Aware Logic Synthesis", 2002, IEEE, pp. 1-8.
Pandini, et al., "Understanding and Addressing the Impact of Wiring Congestion During Technology Mapping", ISPD Apr. 7-10, 2002, ACM Press, pp. 131-136.
Patel, et al., "An Architectural Exploration of Via Patterned Gate Arrays, ISPD 2003", Apr. 6, 2003, pp. 184-189.
Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.
Pham, D., et al., "FINFET Device Junction Formation Challenges," 2006 International Workshop on Junction Technology, pp. 73-77, Aug. 2006.
Poonawala, et al., "ILT for Double Exposure Lithography with Conventional and Novel Materials", 2007, SPIE Proceeding Series, vol. 6520; 65202Q.
Qian et al. "Advanced Physical Models for Mask Data Verification and Impacts on Physical Layout Synthesis" 2003. IEEE.
Ran, et al., "An Integrated Design Flow for a Via-Configurable Gate Array", 2004, IEEE, pp. 582-589.
Ran, et al., "Designing a Via-Configurable Regular Fabric", Custom Integrated Circuits Conference (CICC). Proceedings of the IEEE, Oct. 1, 2004, pp. 423-426.
Ran, et al., "On Designing Via-Configurable Cell Blocks for Regular Fabrics" Proceedings of the Design Automation Conference (DAC) 2004, Jun. 2004, ACM Press, s 198-203.
Ran, et al., "The Magic of a Via-Configurable Regular Fabric", Proceedings of the IEEE International Conference on Computer Design (ICCD) Oct. 2004.
Ran, et al., "Via-Configurable Routing Architectures and Fast Design Mappability Estimation for Regular Fabrics", 2005, IEEE, pp. 25-32.
Reis, et al., "Physical Design Methodologies for Performance Predictability and Manufacturability", Apr. 14-16, 2004, ACM Press, pp. 390-397.
Robertson, et al., "The Modeling of Double Patterning Lithographic Processes", 2007, SPIE Proceeding Series, vol. 6520; 65200J.
Rovner, "Design for Manufacturability in Via Programmable Gate Arrays", May 2003, Graduate School of Carnegie Mellon University.
Sengupta, "An Integrated CAD Framework Linking VLSI Layout Editors and Process Simulators", 1998, Thesis for Rice University, pp. 1-101.
Sengupta, et al., "An Integrated CAD Framework Linking VLSI Layout Editors and Process Simulators", 1996, SPIE Proceeding Series, vol. 2726; pp. 244-252.
Sherlekar, "Design Considerations for Regular Fabrics", Apr. 18-21, 2004, ACM Press, pp. 97-102.
Shi et al., "Understanding the Forbidden Pitch and Assist Feature Placement," Proc. of SPIE vol. 4562, 2002, pp. 968-979.
Smayling et al., "APF Pitch Halving for 22 nm Logic Cells Using Gridded Design Rules," Proceedings of SPIE, USA, vol. 6925, Jan. 1, 2008, pp. 69251E-1-69251E-7.
Sreedhar et al. "Statistical Yield Modeling for Sub-Wavelength Lithography", 2008, IEEE.
Stapper, "Modeling of Defects in Integrated Circuit Photolithographic Patterns", Jul. 1, 1984, IBM, vol. 28 # 4, pp. 461-475.
Taylor, et al., "Enabling Energy Efficiency in Via-Patterned Gate Array Devices", Jun. 7-11, 2004, ACM Press, pp. 874-877.
Tian et al. "Model-Based Dummy Feature Placement for Oxide Chemical_Mechanical Polishing Manufacturability" 2000, ACM.
Tong, et al., "Regular Logic Fabrics for a Via Patterned Gate Array (VPGA), Custom Integrated Circuits Conference", Sep. 2003, Proceedings of the IEEE, pp. 53-56.
Vanleenhove, et al., "A Litho-Only Approach to Double Patterning", 2007, SPIE Proceeding Series, vol. 6520; 65202F.
Wang, et al., "Performance Optimization for Gridded-Layout Standard Cells", 2004, vol. 5567 SPIE.
Wang, J. et al., Standard Cell Layout with Regular Contact Placement, IEEE Trans. on Semicon. Mfg., vol. 17, No. 3, Aug. 2004.
Webb, Clair, "Layout Rule Trends and Affect upon CPU Design", 2006, vol. 6156 SPIE.
Webb, Clair, "45nm Design for Manufacturing," Intel Technology Journal, vol. 12, Issue 02, Jun. 17, 2008, ISSN 1535-864X, pp. 121-130.
Wenren, et al., "The Improvement of Photolithographic Fidelity of Two-dimensional Structures Though Double Exposure Method", 2007, SPIE Proceeding Series, vol. 6520; 65202I.
Wilcox, et al., "Design for Manufacturability: A Key to Semiconductor Manufacturing Excellence", 1998, IEEE, pp. 308-313.
Wu, et al., "A Study of Process Window Capabilities for Two-dimensional Structures under Double Exposure Condition", 2007, SPIE Proceeding Series, vol. 6520; 65202O.
Xiong, et al., "The Constrained Via Minimization Problem for PCB and VLSI Design", 1988, ACM Press/IEEE, pp. 573-578.
Yamamaoto, et al., "New Double Exposure Technique without Alternating Phase Shift Mask", 2007, SPIE Proceeding Series, vol. 6520; 652052P.
Yang, et al., "Interconnection Driven VLSI Module Placement Based on Quadratic Programming and Considering Congestion Using LFF Principles", 2004, IEEE, pp. 1243-1247.
Yao, et al., "Multilevel Routing With Redundant Via Insertion", Oct. 2006, IEEE, pp. 1148-1152.
Zheng, et al."Modeling and Analysis of Regular Symmetrically Structured Power/Ground Distribution Networks", DAC, Jun. 10-14, 2002, ACM Press, pp. 395-398.
Zhu, et al., "A Stochastic Integral Equation Method for Modeling the Rough Surface Effect on Interconnect Capacitance", 2004, IEEE.
Zhu, et al., "A Study of Double Exposure Process Design with Balanced Performance Parameters for Line/Space Applications", 2007, SPIE Proceeding Series, vol. 6520; 65202H.
Zuchowski, et al., "A Hybrid ASIC and FPGA Architecture", 2003, IEEE, pp. 187-194.
Firedberg, et al., "Modeling Within-Field Gate Length Spatial Variation for Process-Design Co-Optimization," 2005 Proc. of SPIE vol. 5756, pp. 178-188.
Hakko, et al., "Extension of the 2D-TCC Technique to Optimize Mask Pattern Layouts," 2008 Proc. of SPIE vol. 7028, 11 pages.
Kawasitima, et al., "Mask Optimization for Arbitrary Patterns with 2D-TCC Resolution Enhancement Technique," 2008 Proc. of SPIE vol. 6924, 12 pages.
Rosenbluth, et al., "Optimum Mask and Source Patterns to Print a Given Shape," 2001 Proc. of SPIE vol. 4346, pp. 486-502.
Socha, et al., "Simultaneous Source Mask Optimization (SMO)," 2005 Proc. of SPIE vol. 5853, pp. 180-193.
Wong, et al., "Resolution Enhancement Techniques and Design for Manufacturability: Containing and Accounting for Variabilities in Integrated Circuit Creation," J. Micro/Nanolith. MEMS MOEMS, Jul.-Sep. 2007, vol. 6(3), 2 pages.
Yamazoe, et al., "Resolution Enhancement by Aerial Image Approximation with 2D-TCC," 2007 Proc. of SPIE vol. 6730, 12 pages.
Yu, et al., "True Process Variation Aware Optical Proximity Correction with Variational Lithography Modeling and Model Calibration," J. Micro/Nanolith. MEMS MOEMS, Jul.-Sep. 2007, vol. 6(3), 16 pages.

* cited by examiner

METHODS AND SYSTEMS FOR PROCESS COMPENSATION TECHNIQUE ACCELERATION

CLAIM OF PRIORITY

This application is a continuation-in-part application under 35 U.S.C. 120 of prior U.S. application Ser. No. 12/033,807, filed on Feb. 19, 2008 now U.S. Pat. No. 7,979,829, entitled "Integrated Circuit Cell Library with Cell-Level Process Compensation Technique (PCT) Application and Associated Methods," which claims priority under 35 U.S.C. 119(e) to U.S. Provisional Application No. 60/890,819, filed on Feb. 20, 2007. The disclosure of each above-identified patent application is incorporated herein by reference.

This application also claims priority under 35 U.S.C. 119 (e) to U.S. Provisional Patent Application No. 61/087,546, filed Aug. 8, 2008, entitled "Methods and Systems for Process Compensation Technique Acceleration." The disclosure of the above-identified provisional patent application is incorporated herein by reference.

CROSS-REFERENCE TO RELATED APPLICATIONS

This application is also related to U.S. patent application Ser. No. 11/683,402, filed on Mar. 7, 2007, and entitled "Dynamic Array Architecture." This application is also related to U.S. patent application Ser. No. 12/013,342, filed on Jan. 11, 2008, and entitled "Semiconductor Device with Dynamic Array Section." This application is also related to U.S. patent application Ser. No. 12/013,356, filed on Jan. 11, 2008, and entitled "Methods for Designing Semiconductor Device with Dynamic Array Section." This application is also related to U.S. patent application Ser. No. 12/013,366, filed on Jan. 11, 2008, and entitled "Methods for Defining Dynamic Array Section with Manufacturing Assurance Halo and Apparatus Implementing the Same." The disclosures of the above-identified patent applications are incorporated herein by reference.

BACKGROUND

Current integrated circuit (IC) design flows are broken into several functions. Design teams typically focus on synthesis, place and route, layout versus schematic (LVS), timing closure, power closure, reliability closure, and design rule checking (DRC). The "GDS-II" database is signed off and released to a post-design processing team which applies various forms of RET (resolution enhancement techniques), mainly OPC (optical proximity correction). OPC is done on pre-defined masking layers, usually using lithographic models provided by the wafer fabrication facility (fab). Each mask layer of the whole chip is run through OPC with the appropriate model, then released to the mask shop for fracturing and mask making.

In today's era of sub-wavelength photolithography, in which the feature sizes are smaller than the wavelength of the exposure light, the full-chip OPC creates patterns for the masks which are difficult to validate for correctness. A number of electronic design automation (EDA) tools are trying to perform "hot spot" checks or design rule checking (DRC) on the full-chip post-OPC databases. Sheer data volumes make this difficult, as the post-OPC databases can be 20 to 100 times larger than the original layout. Therefore, full-chip OPC can be extremely expensive in terms of cost and schedule. In fact, it may take many weeks of processor time to complete a full-chip OPC on a single chip level. Also, OPC done on the full chip at this phase of the design flow is in the critical path for getting the database to the mask shop. Moreover, after the full-chip OPC processing, the chip layout may go through another process called mask proximity correction (MPC) to adjust layout shapes to get better pattern fidelity on the mask, which will add additional delay in releasing the chip layout to the mask shop.

SUMMARY

In one embodiment, a method is disclosed for accelerating process compensation technique (PCT) processing of a semiconductor chip layout. The method includes an operation for replacing selected cells in the semiconductor chip layout with corresponding PCT pre-processed cells. Each PCT pre-processed cell represents a particular selected cell having been previously subjected to a cell-level-PCT-processing operation so as to include PCT-based cell layout adjustments. Following replacement of the selected cells in the semiconductor chip layout with corresponding PCT pre-processed cells, the method includes an operation for performing a chip-wide PCT processing operation on the semiconductor chip layout for a given chip level. The method further includes an operation for recording the chip-wide PCT processed semiconductor layout for the given chip level on a persistent storage medium.

In another embodiment, a method in disclosed for processing a semiconductor chip layout for fabrication. The method includes an operation for obtaining a chip layout having a number of cells placed in a section of the chip layout to form a prescribed integrated circuit. The method also includes an operation for replacing one or more of the number of placed cells with a corresponding PCT pre-processed cell. A given PCT pre-processed cell represents a particular placed cell having been previously subjected to a cell-level-PCT-processing operation so as to include PCT-based cell layout adjustments within the given PCT pre-processed cell. The method further includes an operation for performing a chip-wide PCT processing operation on a given level of the chip layout to generate a chip-wide PCT processed chip layout for the given level of the chip layout. An operation is then performed to record the chip-wide PCT processed chip layout for the given level on a persistent storage medium. The method operations of performing the chip-wide PCT processing operation and recording the chip-wide PCT processed chip layout is repeated for each level of the chip that requires PCT processing for fabrication.

In another embodiment, a PCT processing system is disclosed. The system includes an input module defined to receive a chip layout for PCT processing. The chip layout includes a number of cells placed in a section of the chip layout to form a prescribed integrated circuit. The system also includes a cell substitution module defined to replace one or more of the number of cells in the chip layout with a corresponding PCT pre-processed cell. A given PCT pre-processed cell represents a particular cell having been previously subjected to a cell-level-PCT-processing operation so as to include PCT-based cell layout adjustments within the given PCT pre-processed cell. The system further includes a PCT processing module defined to perform a chip-wide PCT processing operation on specified levels of the chip layout to generate a chip-wide PCT processed chip layout for each of the specified levels of the chip layout. The system also includes an output module defined to record the chip-wide PCT processed chip layout for each of the specified levels of the chip layout on a persistent storage medium.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

As used herein, a process compensation technique (PCT) refers to essentially any processing or adjustment of an integrated circuit (IC) layout for the purpose of improving or ensuring successful fabrication of the features defined by the IC layout. Examples of various PCTs include optical proximity correction (OPC), mask proximity correction (MPC), resolution enhancement techniques (RET), etch proximity compensation, gap fill compensation (e.g., use of dielectric or metal to fill gaps), chemical mechanical planarization (CMP) compensation, among others. It should be understood that the term PCT processing, as used herein, refers to any existing or future form of IC layout processing used to improve or ensure successful fabrication of features defined by the IC layout.

A cell represents an abstraction of a logic function or other signal processing function (analog, RF, optical) to be performed by an integrated circuit, and encapsulates the lower-level integrated circuit layout for implementing the logic function. It should be understood that a given logic function can be represented by multiple cell variations, wherein the cell variations may be differentiated by feature size, performance, and process compensation technique (PCT) processing. For example, multiple cell variations for a given logic function may be differentiated by power consumption, signal timing, current leakage, chip area, OPC, MPC, RET, etc. It should also be understood that each cell description includes the layouts for the cell in each level of the chip, as required to implement the logic function of the cell. More specifically, a cell description includes layouts for the cell in each level of the chip extending from the substrate level up through a particular interconnect level.

Cell-level-PCT-processing can be performed on a number of levels of one or more cells used in a chip-wide layout. For example, in one embodiment, cell-level-PCT-processing can be performed on selected levels of each unique cell in the chip-wide layout. However, in another embodiment, cell-level-PCT-processing can be performed on selected levels of selected cells in the chip-wide layout.

Figure 1:
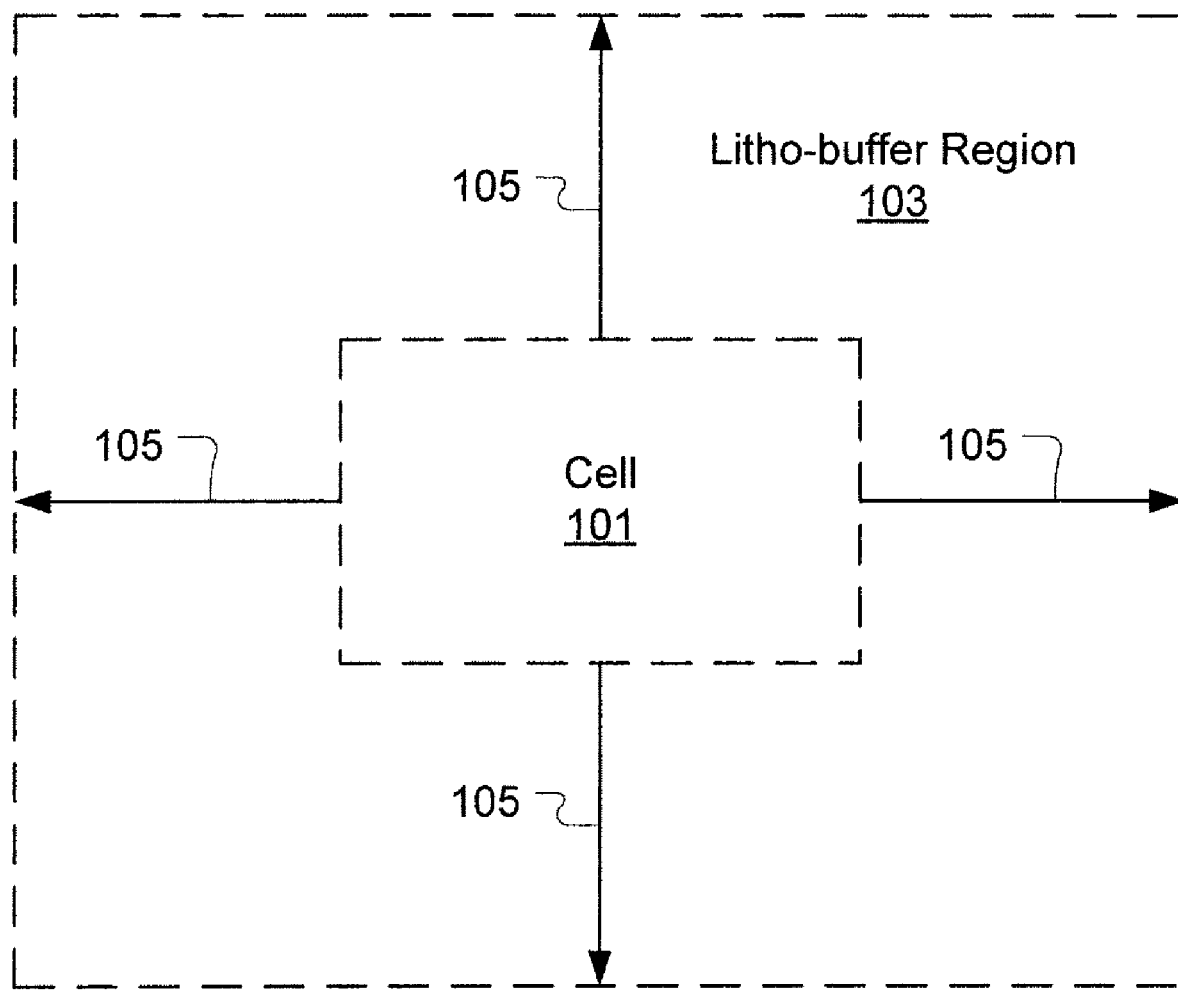
FIG. 1 is an illustration showing an exemplary cell surrounded by a litho-buffer, in accordance with one embodiment of the present invention.

It should be appreciated that the cell-level-PCT processing is performed without explicit consideration of the chip as a whole. However, in performing the cell-level-PCT processing on a given cell, a lithographic buffer region ("litho-buffer" hereafter) is defined around each level of the cell to simulate a chip environment in which the cell may be placed. FIG. 1 is an illustration showing an exemplary cell 101 surrounded by a litho-buffer 103, in accordance with one embodiment of the present invention. Generally speaking, the litho-buffer associated with a given level of the cell is defined to include a number of features that simulate the neighborhood in which the cell will be placed on the chip. The size of the litho-buffer for a given level of the cell is defined by the outward extent of the litho-buffer from the cell. The size of the litho-buffer for a given level of the cell is set such that the litho-buffer covers an area capable of lithographically influencing the given level of the cell. For example, with regard to FIG. 1, the size of the litho-buffer 103 is defined by its outward extent from the cell 101, as indicated by arrows 105. Alternatively, a "process buffer" could be defined if the range of influence for a given process step is larger than the lithographic influence.

In one embodiment, the outward extent of the litho-buffer can vary on different sides of the cell. In another embodiment, the outward extent of the litho-buffer is the same on each side of the cell. In one embodiment, the litho-buffer for a given level of the cell is defined to extend about 1 micrometer outward from each side of the cell. It should be understood that litho-buffers of different size can be used in different embodiments. Also, litho-buffers of different size can be used for different levels of the same cell. However, in one embodiment, a single litho-buffer size is used for each level of the same cell.

During cell-level-PCT processing, features in the various level layouts of the cell are adjusted to include PCT shapes. For example, in one embodiment, during cell-level-PCT processing, a layout of a given level of a cell is OPC processed to include OPC shapes. In another exemplary embodiment, during cell-level-PCT processing, a layout of a given level of a cell is OPC processed and MPC processed to include both OPC shapes and MPC shapes. The manner in which the PCT shapes are defined and placed can be specified/controlled through a set of PCT rules. The PCT corrections can vary in size, shape, and placement, depending on the particular cell architecture, i.e., layout shapes, sizes, and spacing. The PCT processed cell layouts can be put back into the cell database, i.e., cell library, or can be used to create a new cell database.

In a regular architecture that avoids bends in features of certain chip levels, the PCT corrections are primarily intended to maintain the line width of each feature in critical regions. Therefore, with a cell of regular architecture, the PCT corrections can be relatively simple, such as one-dimensional corrections. For example, the critical dimension (CD) of the gate feature over the diffusion region, i.e., active region, would be important as it defines the transistor length. Whereas the CD of the gate feature over the field region, i.e., non-active region, is not as critical. Similarly, for interconnect features, the line width of the interconnect feature associated with a contact or a via is more important than the line width of the interconnect feature between connection points, i.e., between contacts or vias. In one embodiment, a cell of regular architecture can be defined according to the dynamic array architecture as described in each of co-pending U.S. patent application Ser. Nos. 11/683,402; 12/013,342; 12/013,356; and 12/013,366, which are incorporated in their entirety herein by reference.

One advantage of the regular architecture is that line-end shortening and corner rounding are less of a concern than in an arbitrary architecture that includes many feature bends and corners, which can significantly complicate lithographic resolution. For example, in one embodiment of the regular architecture, diffusion areas have bends and require two-dimensional PCT corrections; however, the gate level layout, contact layout, via layout, and a number of interconnect level layouts include only linear shaped features that require only one-dimensional, i.e., linear, PCT corrections.

Figure 2A:
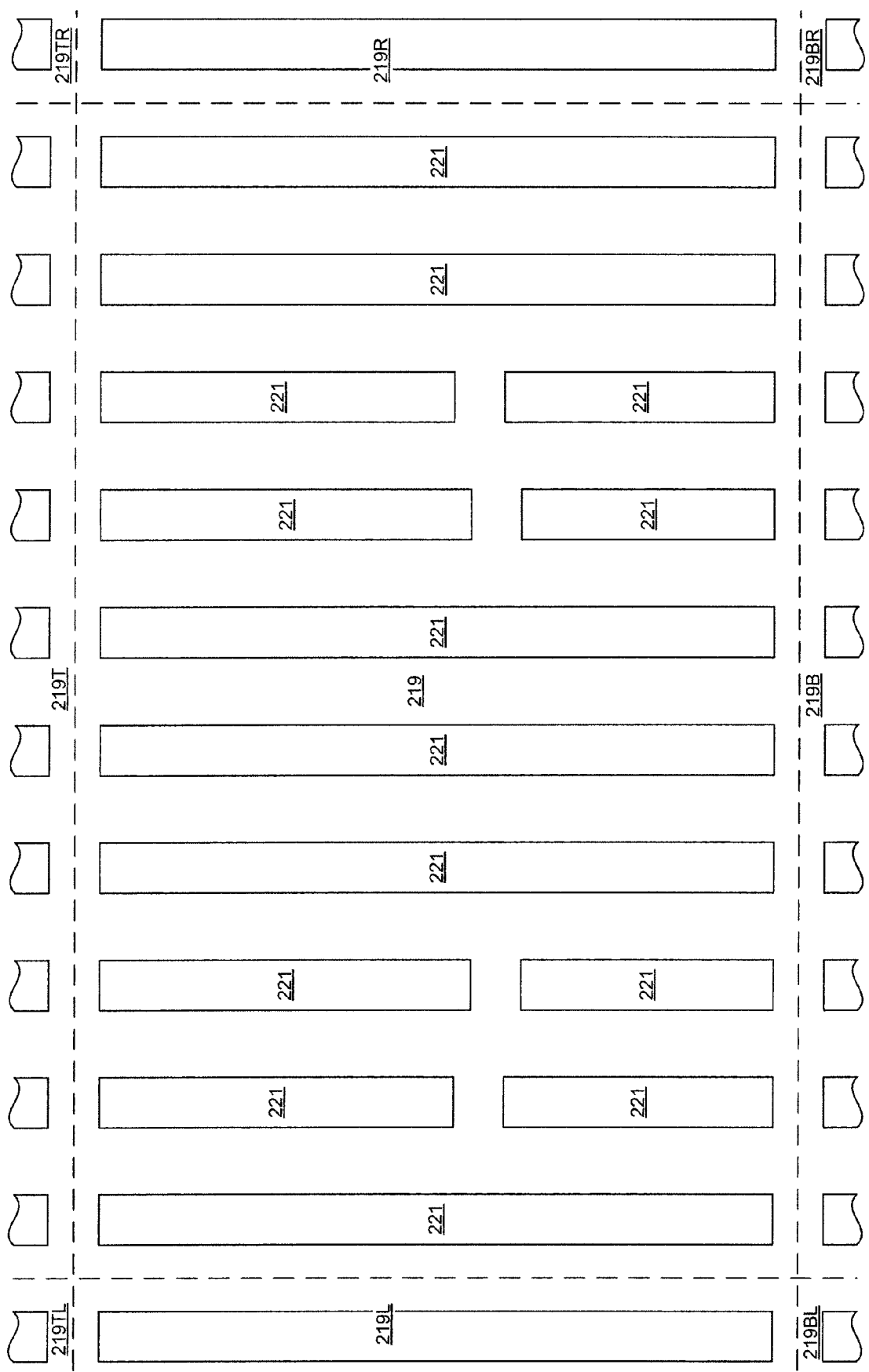
FIG. 2A is an illustration showing a layout of a gate level of a cell prior to cell-level-PCT processing, in accordance with one embodiment of the present invention.

FIG. 2A is an illustration showing a layout of a gate level of a cell 219 prior to cell-level-PCT processing, in accordance with one embodiment of the present invention. The cell 219 is defined according to a regular architecture. Therefore, the gate level includes a number of linear features 221 having a common orientation and a regular feature-to-feature pitch. Also, the litho-buffer for the gate level is defined around cell 219 by duplicate instantiations of cell 219, namely cell 219TL, cell 219T, cell 219TR, cell 219R, cell 219BR, cell 219B, cell 219BL, and cell 219L.

Figure 2B:
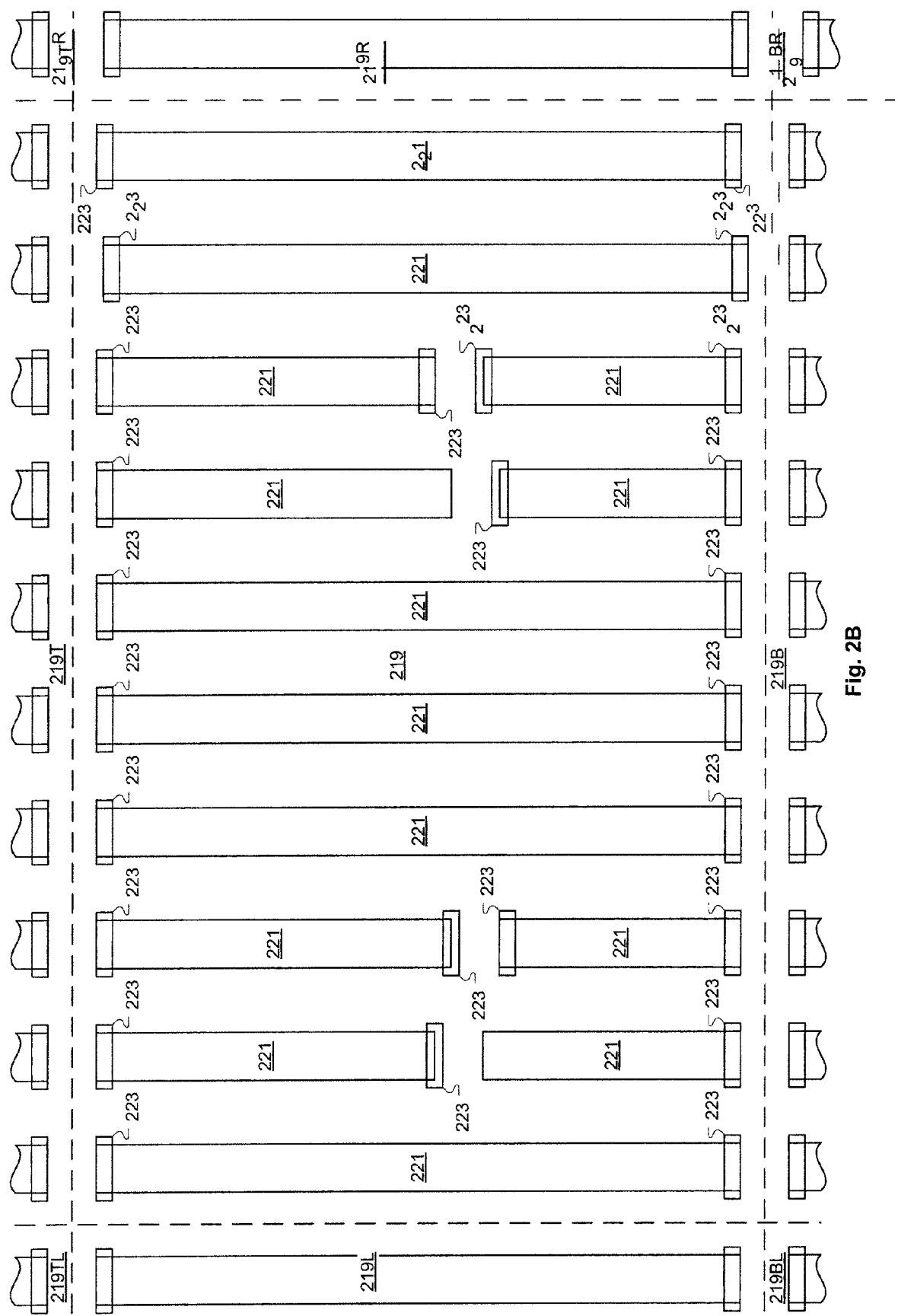
FIG. 2B is an illustration showing the gate level layout of cell with cell-level-PCT processing performed thereon, in accordance with one embodiment of the present invention.

FIG. 2B is an illustration showing the gate level layout of cell 219 with cell-level-PCT processing performed thereon, in accordance with one embodiment of the present invention. A number of PCT correction shapes 223 are placed at the ends of a number of the linear features 221 to combat line-end-rounding and line-end-shortening effects. As previously mentioned, because the gate level of cell 219 follows the regular architecture, the PCT correction shapes 223 are simple and one-dimensional, i.e., linear.

The sufficiency of PCT processing of a given cell level can be evaluated by generating a simulation of the as-fabricated aerial image of the given PCT processed cell level, and by comparing the generated simulation of the as-fabricated aerial image of the given PCT processed cell level to an original as-drawn layout of the given cell level. In one embodiment, the as-fabricated aerial image of the cell level is generated using a tool designed to simulate how features of a given layout will appear, i.e., be shaped, when fabricated using specified processes and equipment at a particular semiconductor factory.

In one embodiment, the sufficiency of PCT processing of a given cell level can be evaluated by measuring edge differentials between the feature contour edges in the as-fabricated aerial image simulation and the as-drawn layout feature edges. The as-drawn layout feature edges are represented by the original layout of the cell level prior to PCT processing. If the measured edge differentials are not acceptable, i.e., are too large, the PCT processing of the cell level is refined to reduce the measured edge differentials. If the measured edge differentials are acceptable, the final PCT processed version of the cell level and its as-fabricated aerial image are stored in a cell library, which may be the original cell library or a new cell library. It should be appreciated that the aerial images may be used during parametric extraction and library characterization to improve the accuracy of library models.

Based on the foregoing, it should be understood that the cell-level-PCT processing of each level of each cell is performed in an iterative manner until an acceptable as-fabricated aerial image of the cell level is obtained based on measured edge differentials. Also, it should understood that a library of cells having been PCT processed can be generated and may include the simulated as-fabricated aerial image of each PCT processed level of each cell.

The cell-level PCT processing results and associated as-fabricated aerial images can be placed in a cell library. Then, for a design that uses a cell which has already been PCT processed, the as-fabricated aerial images of the cell can be obtained from the cell library and used in the design layout, rather than using the idealized polygon representation of cell. Because PCT processing capability can vary between different semiconductor fabrication facilities, multiple fab-specific versions of a given PCT processed cell may be created. Therefore, a given fab-specific cell library may be generated, or fab-specific data typing may be used to distinguish between PCT processed cells for different fabs in a common cell library. More specifically, the PCT processed cells and corresponding aerial/post-etch images can be created on separate layout data file layers or could be on individual data types within each layer.

The PCT processed version of a particular cell should be selected from the cell library according to the fabrication facility to be used. Appropriate mapping during cell library export should ensure delivery of the correct cell library to a given customer. Also, the aerial images may be encrypted in the cell library to be kept from view of unauthorized entities. It should be appreciated that by doing cell-level PCT processing and creating an associated PCT processed cell library, post-design processing of the layout data file is greatly reduced. Moreover, when the PCT processed cells are provided to the fabricator, the required PCT processing by the fabricator is significantly reduced, particularly in the front end of line levels.

Figure 3:
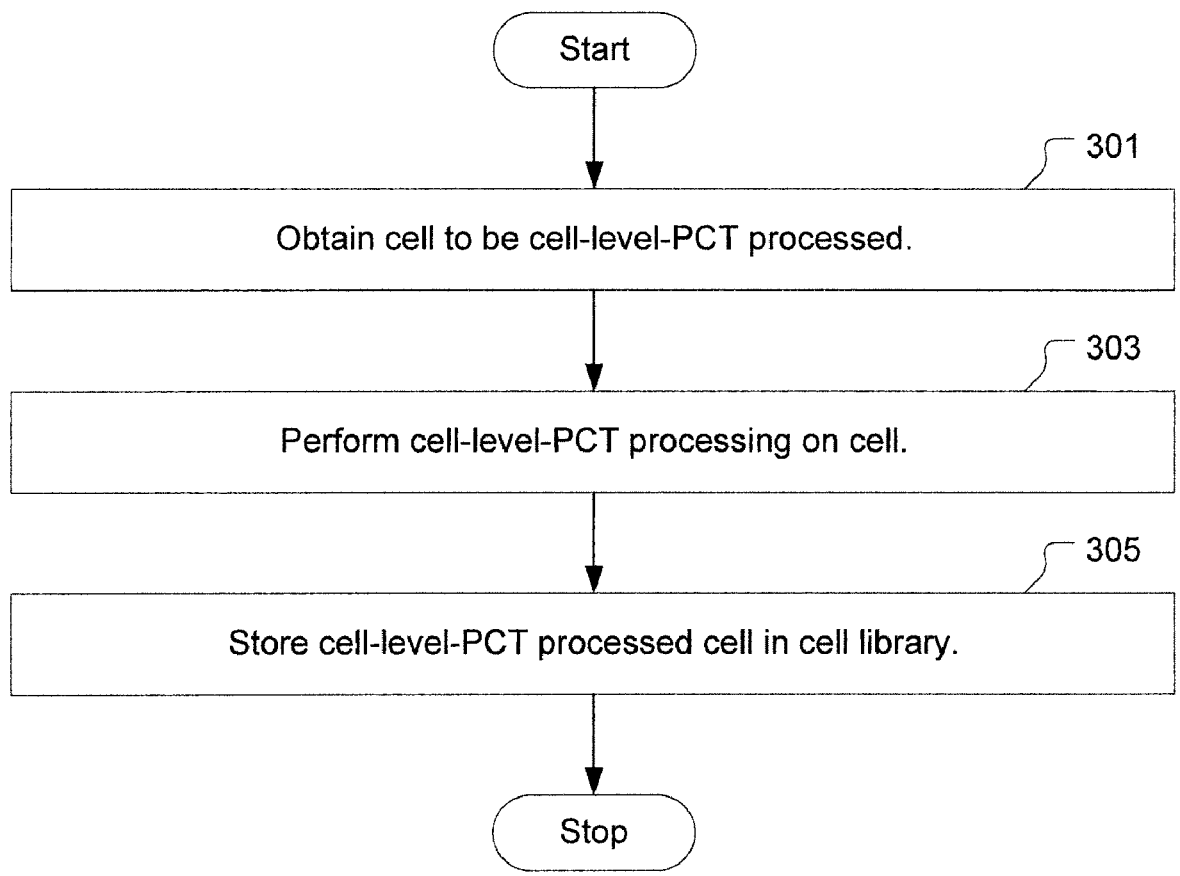
FIG. 3 is an illustration showing a flowchart of a method for generating a library of PCT processed cells for use in an integrated circuit design, in accordance with one embodiment of the present invention.

FIG. 3 is an illustration showing a flowchart of a method for generating a library of PCT processed cells for use in an integrated circuit design, in accordance with one embodiment of the present invention. The method includes an operation 301 for obtaining a cell to be cell-level-PCT processed. The cell obtained in operation 301 can be acquired from an existing cell library, created by modification of a cell acquired from an existing cell library, or created from scratch. The method then proceeds with an operation 303 for performing cell-level-PCT processing on a number of levels of the obtained cell. In one embodiment, the cell-level-PCT-processing includes OPC processing of selected levels of the cell.

In another embodiment, the cell-level-PCT-processing includes OPC and MPC processing of selected levels of the cell.

It should be understood that the cell to be cell-level-PCT processed in the method of FIG. 3 may not be associated with a particular chip layout. Therefore, the cell-level-PCT processing of the cell in the method of FIG. 3 is performed in an iterative manner until acceptable as-fabricated aerial images of the selected cell levels are obtained based on measured edge differentials. The method further includes an operation 305 for storing the cell having been cell-level-PCT processed in a cell library. Operations 301-305 are repeated for a number of cells to generate the library of PCT processed cells for use in integrated circuit design. The generated library of PCT processed cells can also include the simulated as-fabricated aerial image of each PCT processed level of each cell.

Figure 4:
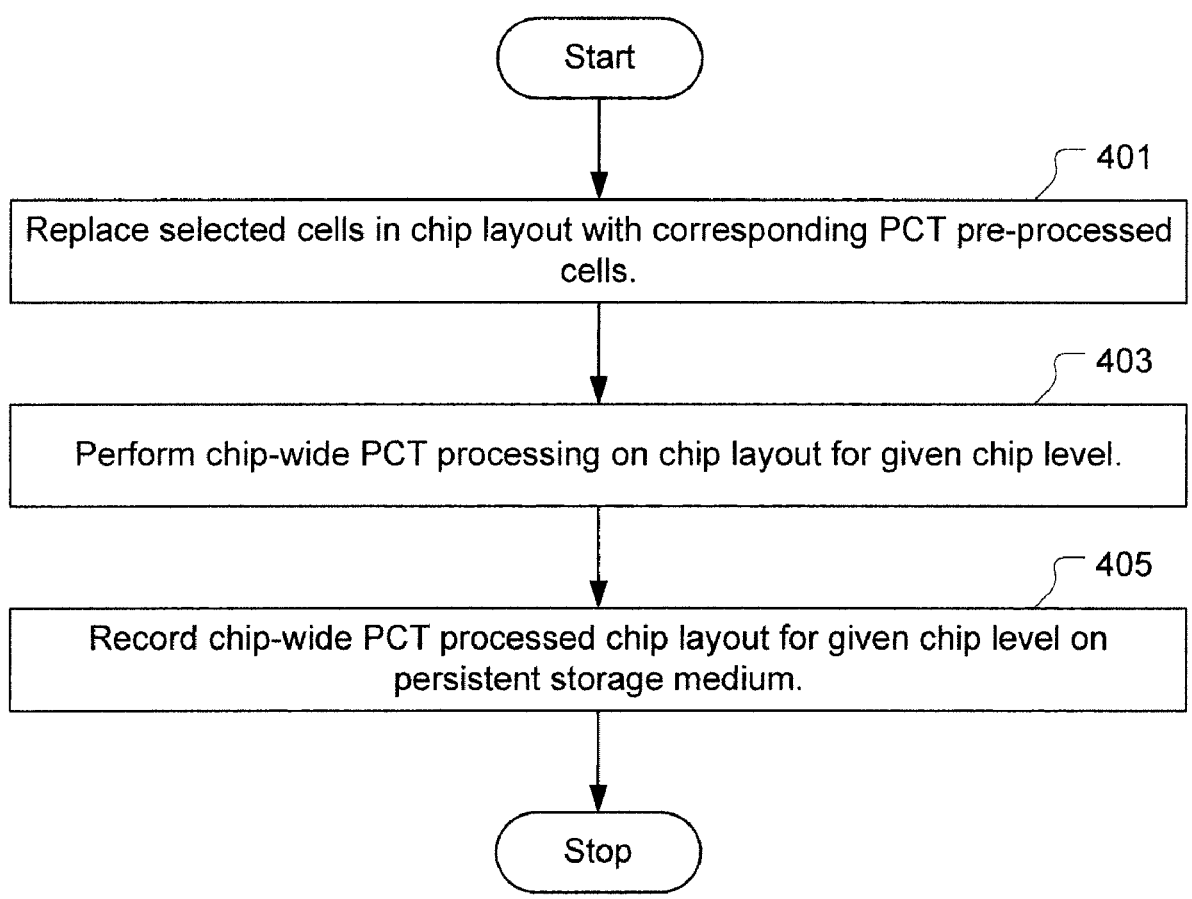
FIG. 4 is an illustration showing a flowchart of a method for accelerating PCT processing of a semiconductor chip layout, in accordance with one embodiment of the present invention.
Figure 5A:
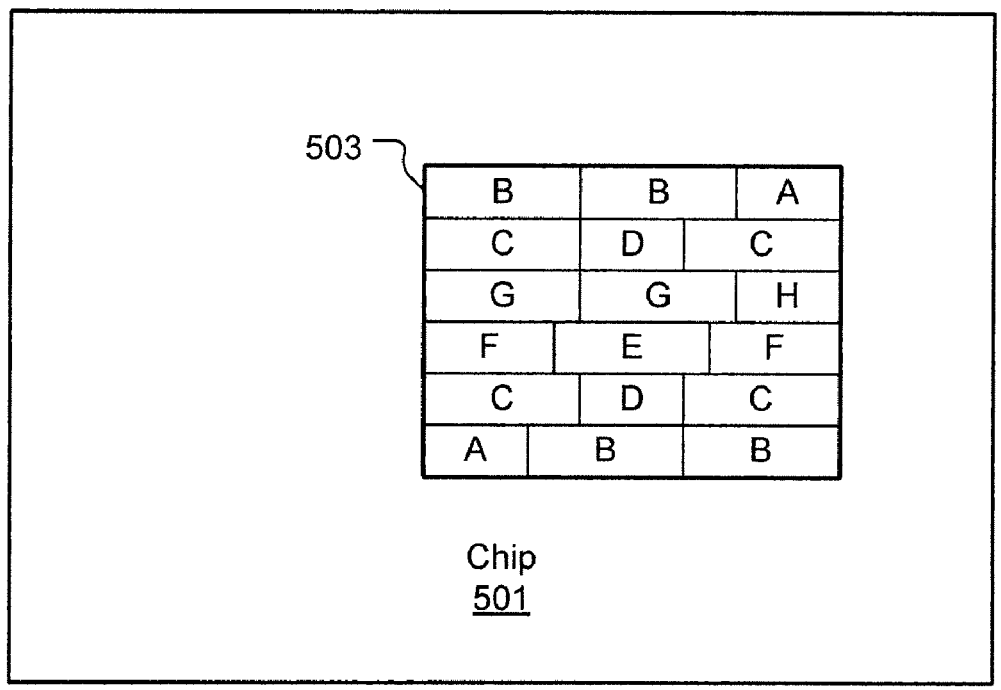
FIG. 5A shows an exemplary chip layout for a given level of a chip, in accordance with one embodiment of the present invention.
Figure 5B:
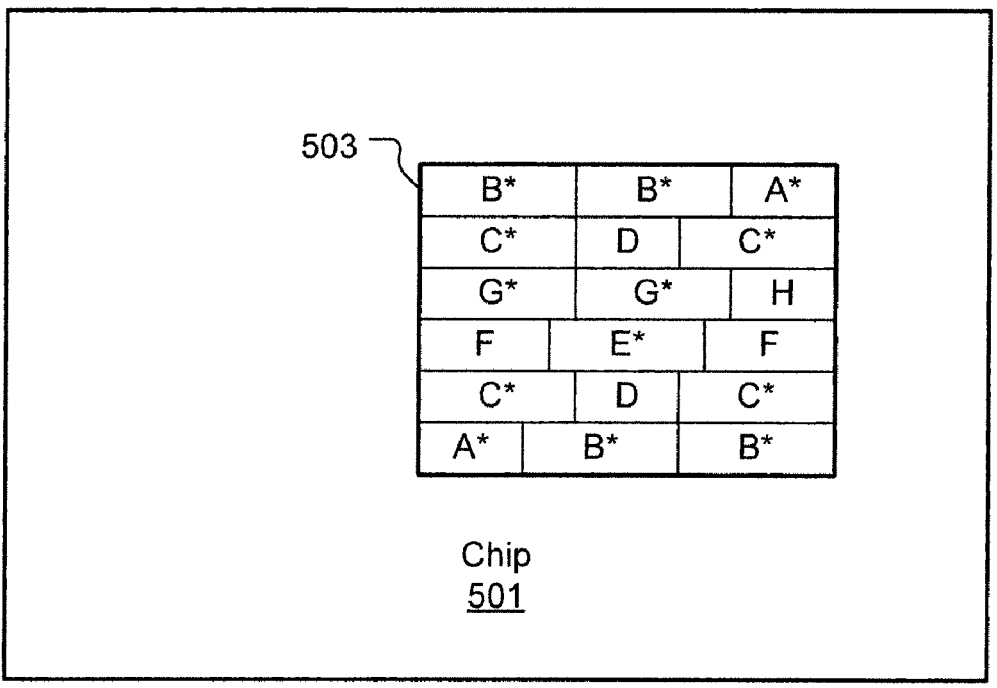
FIG. 5B shows the exemplary chip layout of FIG. 5A with selected cells replaced with corresponding PCT pre-processed cells, in accordance with one embodiment of the present invention.

FIG. 4 is an illustration showing a flowchart of a method for accelerating PCT processing of a semiconductor chip layout, in accordance with one embodiment of the present invention. The method includes an operation 401 for replacing selected cells in a chip layout with corresponding PCT pre-processed cells. Each PCT pre-processed cell represents a particular selected cell having been previously subjected to a cell-level-PCT-processing operation so as to include PCT-based cell layout adjustments. For example, FIG. 5A shows an exemplary chip layout 501 for a given level of a chip. The chip layout 501 includes a section 503 having a number of cells (A-H) placed therein. FIG. 5B shows the exemplary chip layout 501 with selected cells in the section 503 replaced with corresponding PCT pre-processed cells. Specifically, cells having a * designation in the section 503 of FIG. 5B represent cells that have been replaced with corresponding PCT pre-processed cells. Thus, cells A*, B*, C*, E*, and G* represent PCT pre-processed cells, and cells D, F, and H represent original cells, i.e., cells that have not been replaced with PCT pre-processed cells.

It should be understood that the operation 401 may include replacing any number of cells in a chip layout with corresponding PCT pre-processed cells. For example, in one embodiment, all cells in a section of a chip layout may be replaced with corresponding PCT pre-processed cells. In another embodiment, such as that depicted in FIG. 5B, a portion of cells in a section of a chip layout may be replaced with corresponding PCT pre-processed cells. In one embodiment, the selected cells that are replaced in operation 401 with corresponding PCT pre-processed cells are standard cells. In another embodiment, the selected cells that are replaced in operation 401 with corresponding PCT pre-processed cells are non-memory cells, and may or may not be standard cells.

Figure 5C:
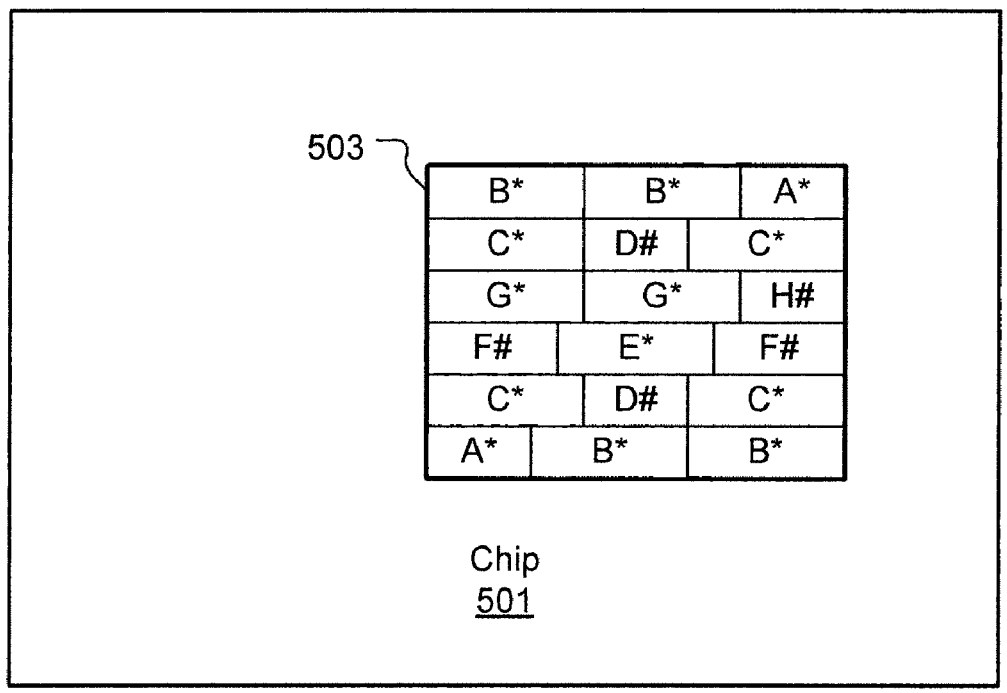
FIG. 5C shows the exemplary chip layout of FIG. 5B with identification of cells having been subjected to the chip-wide PCT processing, in accordance with one embodiment of the present invention.

The method of FIG. 4 continues with an operation 403 for performing a chip-wide PCT processing operation on the chip layout for a given chip level. It should be understood that the operation 403 is performed following the operation 401. Therefore, the chip-wide PCT processing operation is performed on the chip layout with the replacement PCT pre-processed cells present in the chip layout. In one embodiment, the chip-wide PCT processing of operation 403 is performed without PCT processing of the PCT pre-processed cells present within the chip layout. FIG. 5C shows the exemplary chip layout 501 with identification of cells having been subjected to the chip-wide PCT processing of operation 403. Specifically, cells having a # designation in the section 503 of FIG. 5C represent cells that have been subjected to the chip-wide PCT processing of operation 403. Therefore, in accordance with the present embodiment, the cells D, F, and H which were not replaced with PCT pre-processed cells were subjected to the chip-wide PCT processing operation, and the PCT pre-processed cells A*, B*, C*, E*, and G* were not subjected to the chip-wide PCT processing of operation 403.

Figure 5D:
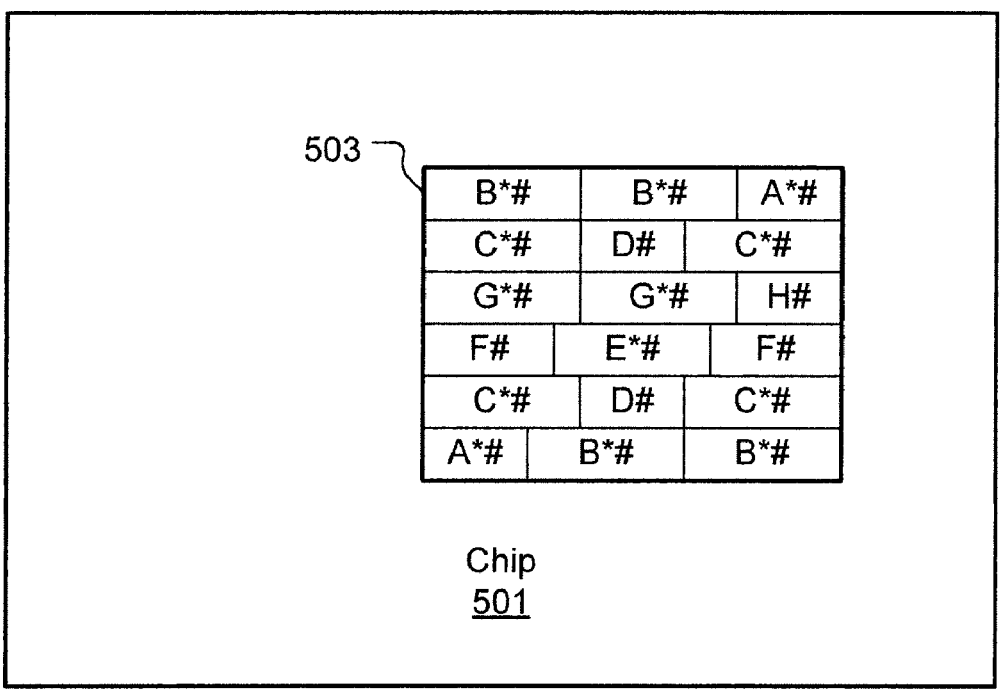
FIG. 5D shows the exemplary chip layout of FIG. 5B with identification of cells having been subjected to the chip-wide PCT processing, in accordance with one embodiment of the present invention.

In another embodiment, the chip-wide PCT processing of operation 403 includes PCT processing of the PCT pre-processed cells present within the semiconductor chip layout. In this embodiment, the chip-wide PCT processing of a given PCT pre-processed cell considers the PCT-based cell layout adjustments already present in the given PCT pre-processed cell, thereby accelerating the PCT processing of the chip layout. FIG. 5D shows the exemplary chip layout 501 with identification of cells having been subjected to the chip-wide PCT processing of operation 403. Specifically, cells having a # designation in the section 503 of FIG. 5D represent cells that have been subjected to the chip-wide PCT processing of operation 403. Therefore, in accordance with the present embodiment, the cells D, F, and H which were not replaced with PCT pre-processed cells were subjected to the chip-wide PCT processing operation, and the PCT pre-processed cells A*, B*, C*, E*, and G* were also subjected to the chip-wide PCT processing of operation 403.

The method further includes an operation 405 for recording the chip-wide PCT processed layout for the given chip level on a persistent storage medium. In one embodiment, the persistent storage medium is a computer readable medium.

In one embodiment, the method of FIG. 4 includes another operation for specifying one or more PCT pre-processed cells in the chip layout for PCT processing during the chip-wide PCT processing operation. In this embodiment, these specified PCT pre-processed cells are subjected to PCT processing during operation 403. Also, in this embodiment, non-specified PCT pre-processed cells in the chip layout are not subjected to PCT processing during the chip-wide PCT processing operation.

Figure 5E:
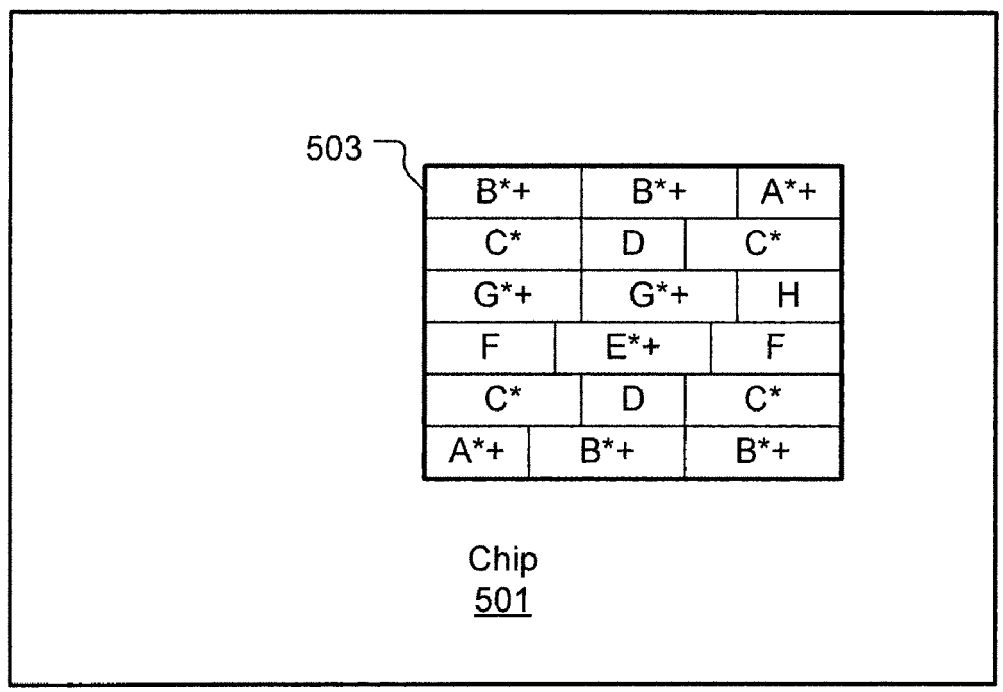
FIG. 5E shows the exemplary chip layout of FIG. 5A with specification of cells for PCT processing during the chip-wide PCT processing, in accordance with one embodiment of the present invention.
Figure 5F:
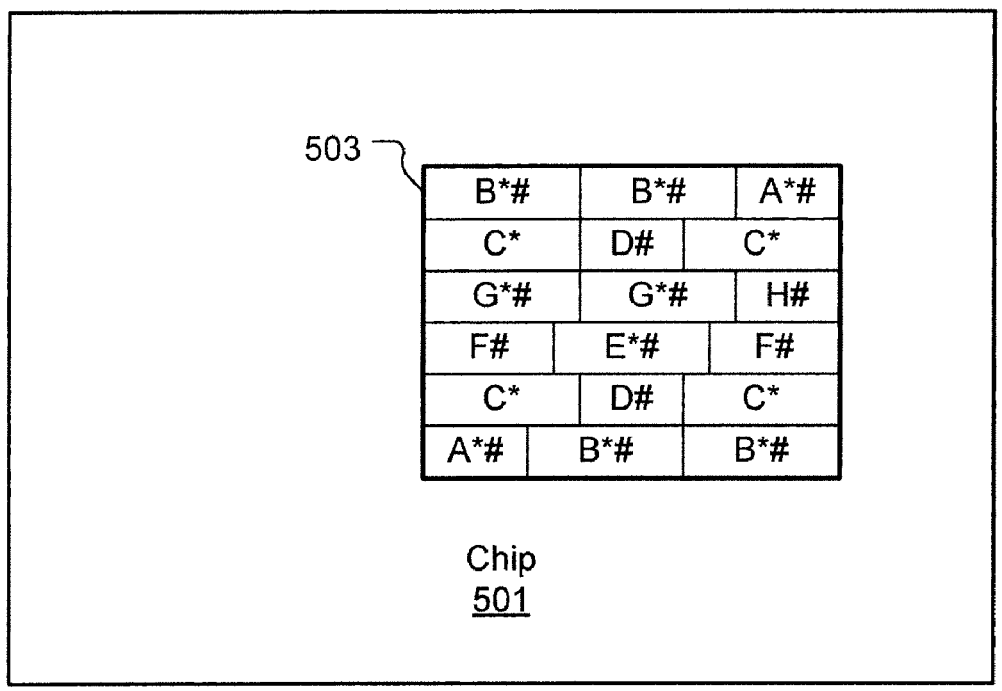
FIG. 5F shows the exemplary chip layout of FIG. 5E with identification of cells having been subjected to the chip-wide PCT processing, in accordance with one embodiment of the present invention.

FIG. 5E shows the exemplary chip layout 501 with specification of PCT pre-processed cells to be PCT processed during the chip-wide PCT processing of operation 403. Specifically, cells having a +designation in the section 503 of FIG. 5E represent PCT pre-processed cells that have been specified for PCT processing during the chip-wide PCT processing of operation 403. Therefore, in accordance with the present embodiment, the A*+, B*+, E*+, and G*+PCT pre-processed cells are to be subjected to the chip-wide PCT processing of operation 403. FIG. 5F shows the exemplary chip layout 501 of FIG. 5E following the operation 403. As shown in section 503 of FIG. 5F, the PCT pre-processed cells A*#, B*#, E*#, and G*# were subjected to the chip-wide PCT processing of operation 403, and the PCT pre-processed cell C* was not subjected to the chip-wide PCT processing of operation 403. Also, section 503 of FIG. 5F shows that the non-PCT pre-processed cells D#, F#, and H# were subjected to the chip-wide PCT processing of operation 403. In one embodiment, non-PCT pre-processed cells within the chip layout are subject to the chip-wide PCT processing of operation 403 by default.

In one embodiment, the PCT processing operations in the method of FIG. 4 include an OPC processing operation. In another embodiment, the PCT processing operations in the method of FIG. 4 include both an OPC processing operation and an MPC processing operation. It should be understood, however, that in other embodiments the PCT processing operations in the method of FIG. 4 can include essentially any type and combination of PCT processing.

In view of the foregoing, in one embodiment, PCT processing of a chip layout is accelerated by replacing a number of cells in a chip layout with PCT pre-processed cells, and through bypassing PCT processing of the PCT pre-processed cells when performing PCT processing on the chip layout. It should be appreciated that bypassing PCT processing of the PCT pre-processed cells when performing PCT processing on the chip layout will accelerate the PCT processing of the chip layout.

In another embodiment, PCT processing of a chip layout is accelerated by replacing a number of cells in a chip layout with PCT pre-processed cells, and through PCT processing of the PCT pre-processed cells when performing PCT processing on the chip layout. In this embodiment, it should be understood that the PCT processing of a given PCT pre-processed cell considers PCT-based cell layout adjustments already present in the given PCT pre-processed cell. Therefore, PCT processing of a PCT pre-processed cell should proceed more rapidly than PCT processing of a cell that has not yet been subjected to PCT processing, thereby accelerating the PCT processing of the chip layout.

In another embodiment, PCT processing of a chip layout is accelerated by replacing a number of cells in a chip layout with PCT pre-processed cells, and through PCT processing of selected PCT pre-processed cells when performing PCT processing on the chip layout, and through bypassing PCT processing of non-selected PCT pre-processed cells when performing PCT processing on the chip layout. In this embodiment, it should be understood that the PCT processing of a given PCT pre-processed cell considers PCT-based cell layout adjustments already present in the given PCT pre-processed cell. Therefore, PCT processing of a PCT pre-processed cell should proceed more rapidly than PCT processing of a cell that has not yet been subjected to PCT processing, thereby accelerating the PCT processing of the chip layout.

Also, bypassing PCT processing of some (non-selected) PCT pre-processed cells when performing PCT processing on the chip layout will accelerate the PCT processing of the chip layout. In this embodiment, the PCT pre-processed cells selected for chip-wide PCT processing may be selected based on design intent. For example, PCT pre-processed cells selected for chip-wide PCT processing may be selected based on timing critical path considerations, leakage considerations, cross-talk noise consideration, manufacturability considerations, or essentially any other consideration or combination of considerations.

The PCT processing of the cells and chip layout in each of the above-described embodiments may include any type of PCT processing operation. In one embodiment, the PCT processing of the cells and chip layout in each of the above-described embodiments includes OPC processing operations. In another embodiment, the PCT processing of the cells and chip layout in each of the above-described embodiments includes OPC and MPC processing operations.

Figure 6:
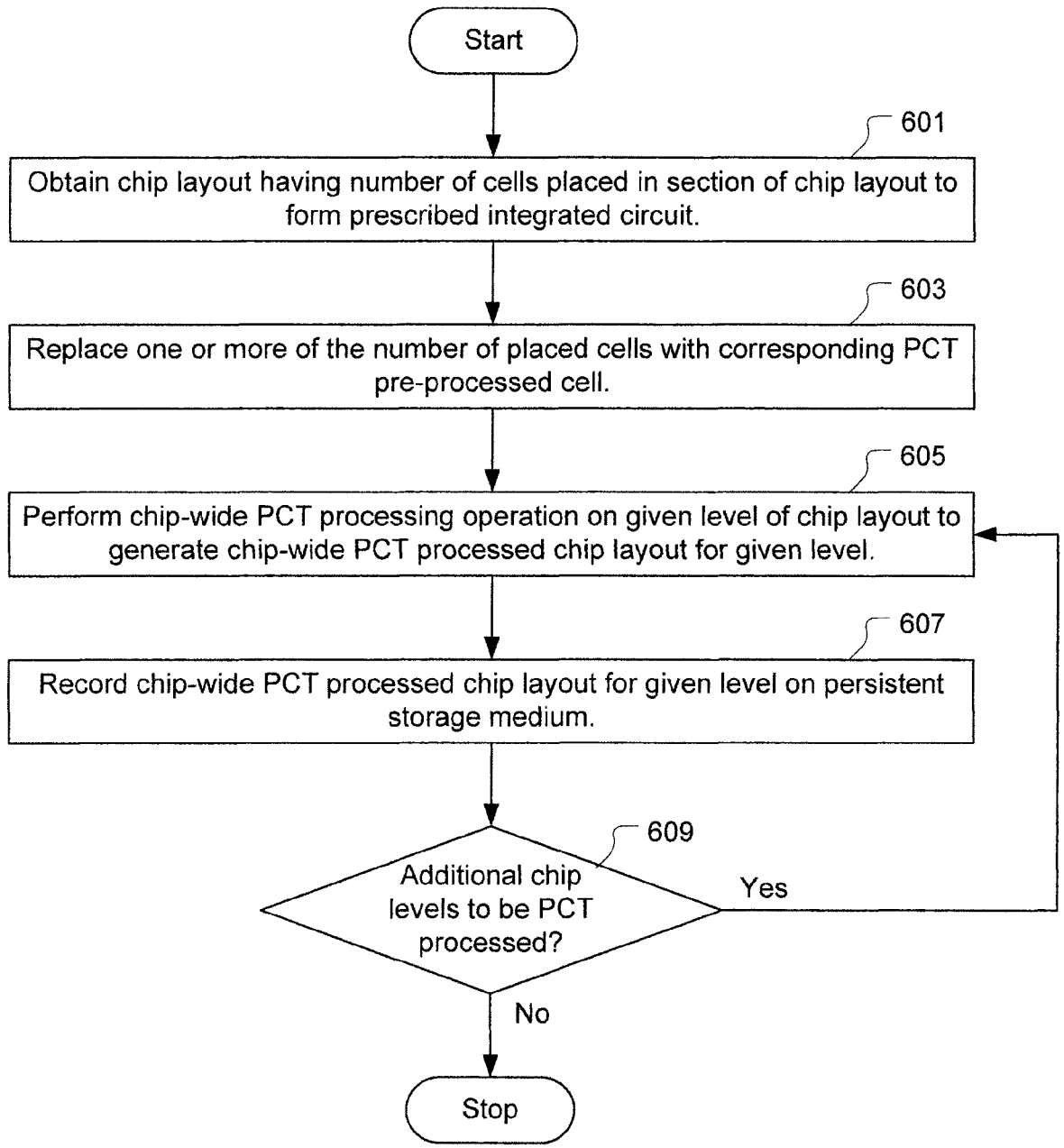
FIG. 6 is an illustration showing a flowchart of a method for processing a semiconductor chip layout for fabrication, in accordance with one embodiment of the present invention.

FIG. 6 is an illustration showing a flowchart of a method for processing a semiconductor chip layout for fabrication, in accordance with one embodiment of the present invention. The method includes an operation 601 for obtaining a chip layout having a number of cells placed in a section of the chip layout to form a prescribed integrated circuit. The method also includes an operation 603 for replacing one or more of the number of placed cells with a corresponding PCT pre-processed cell. As previously stated, a given PCT pre-processed cell represents a particular placed cell having been previously subjected to a cell-level-PCT-processing operation so as to include PCT-based cell layout adjustments within the given PCT pre-processed cell.

The method further includes an operation 605 for performing a chip-wide PCT processing operation on a given level of the chip layout to generate a chip-wide PCT processed chip layout for the given level. The method also includes an operation 607 for recording the chip-wide PCT processed chip layout for the given level on a persistent storage medium. In one embodiment, the chip-wide PCT processed chip layout is recorded in a digital format on a computer readable storage medium. The method then proceeds with a decision operation 609 to determine whether chip-wide PCT processing is to be performed on additional chip levels. If additional chip levels are to be PCT processed, the method reverts from operation 609 back to operation 605. Otherwise, the method concludes.

In one embodiment, the chip-wide PCT processing of operation 605 is performed without PCT processing of the PCT pre-processed cells within the chip layout, thereby accelerating the PCT processing of the chip layout for the given chip level. In another embodiment, the chip-wide PCT processing of operation 605 includes PCT processing of the PCT pre-processed cells within the chip layout. The PCT processing of a given PCT pre-processed cell within the chip layout begins with the PCT-based cell layout adjustments present within the given PCT pre-processed cell, thereby accelerating the PCT processing of the chip layout for the given chip level.

In yet another embodiment, prior to operation 605, an operation is performed to specify one or more PCT pre-processed cells in the chip layout for PCT processing during the chip-wide PCT processing of operation 605. Then, during operation 605, the one or more specified PCT pre-processed cells in the chip layout are subjected to the chip-wide PCT processing, and non-specified PCT pre-processed cells in the chip layout are not subjected to the chip-wide PCT processing. Bypassing PCT processing of the non-specified PCT pre-processed cells in the chip layout serves to accelerate PCT processing of the chip layout. Also, because the PCT processing of the specified PCT pre-processed cells within the chip layout begins with the PCT-based cell layout adjustments present within each of the specified PCT pre-processed cells, the PCT processing of the chip layout is further accelerated.

The PCT processing of the cells and chip layout in the method of FIG. 6 may include essentially any type and combination of PCT processing operations. In one embodiment, the PCT processing of the cells and chip layout in the method of FIG. 6 includes OPC processing operations. In another embodiment, the PCT processing of the cells and chip layout in the method of FIG. 6 includes both OPC and MPC processing operations. Also, in one embodiment, the cells placed in the section of the chip layout to form the prescribed integrated circuit are standard cells. In another embodiment, the cells placed in the section of the chip layout to form the prescribed integrated circuit are non-memory cells, and may or may not be standard cells. Additionally, in one embodiment, the operations of the method of FIG. 6 are performed by computer executable program instructions stored on a computer readable medium and executed by a computer.

Figure 7:
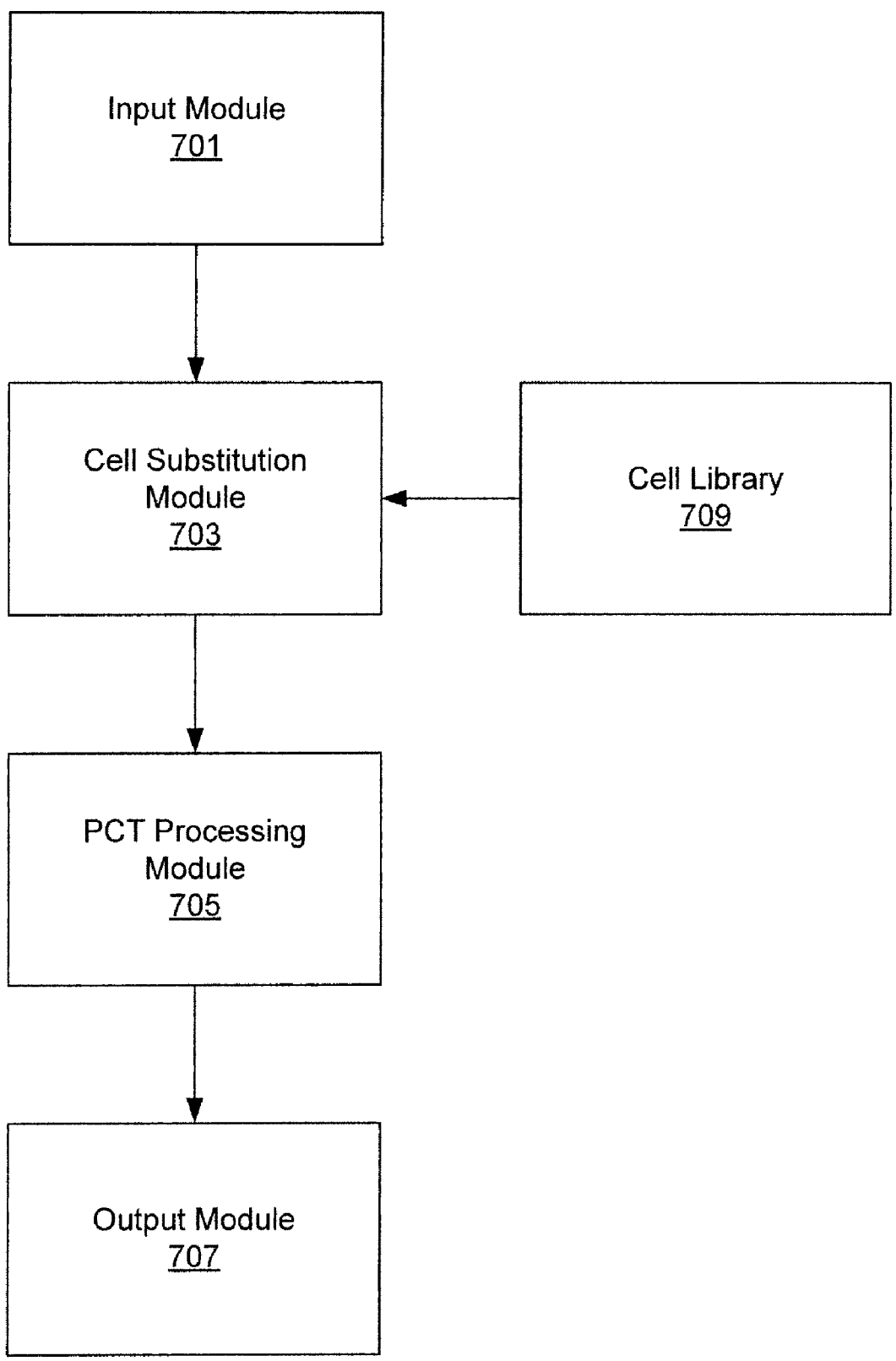
FIG. 7 is an illustration showing a PCT processing system, in accordance with one embodiment of the present invention.

FIG. 7 is an illustration showing a PCT processing system, in accordance with one embodiment of the present invention. The system includes an input module 701 defined to receive a chip layout for PCT processing. The chip layout includes a number of cells placed in a section of the chip layout to form a prescribed integrated circuit. In one embodiment the placed cells are standard cells. In another embodiment, the placed cells are non-memory cells and may or may not be standard cells. The system also includes a cell substitution module 703 defined to replace one or more of the cells in the chip layout with a corresponding PCT pre-processed cell. As previously stated, a given PCT pre-processed cell represents a particular cell having been previously subjected to a cell-level-PCT-processing operation so as to include PCT-based cell layout adjustments within the given PCT pre-processed cell. In one embodiment, the system includes a cell library 709 that is accessible by the cell substitution module 703. The cell library includes PCT pre-processed cells for use by the cell substitution module 703 in replacing cells in the chip layout.

The system further includes a PCT processing module 705 defined to perform a chip-wide PCT processing operation on the chip layout of specified chip levels to generate a chip-wide PCT processed chip layout for each of the specified chip levels. The PCT processing module 705 may be defined to operate in a selected mode of operation. In a first selectable mode of operation, the PCT processing module 705 performs the chip-wide PCT processing operation without PCT processing of the PCT pre-processed cells within the chip layout. In a second selectable mode of operation, the PCT processing module 705 operates to PCT process the PCT pre-processed cells within the chip layout during the chip-wide PCT processing operation. Also, in the second selectable mode of operation, the PCT processing module 705 operates to begin PCT processing of a given PCT pre-processed cell within the chip layout with consideration of the PCT-based cell layout adjustments already present within the given PCT pre-processed cell.

In a third selectable mode of operation, the PCT processing module 705 operates to PCT process tagged PCT pre-processed cells in the chip layout during the chip-wide PCT processing operation, and operates to skip PCT processing of non-tagged PCT pre-processed cells in the chip layout during the chip-wide PCT processing operation. In the third selectable mode of operation, the PCT processing module 705 operates to begin PCT processing of a tagged PCT pre-processed cell within the chip layout with consideration of the PCT-based cell layout adjustments already present within the tagged PCT pre-processed cell.

The system further includes an output module 707 defined to record the chip-wide PCT processed chip layout, for each of the specified levels of the chip layout, on a persistent storage medium. In one embodiment, the output module 707 operates to record the chip-wide PCT processed chip layout in a digital format on a computer readable storage medium. Each of the input module 701, the cell substitution module 703, the cell library 709, the PCT processing module 705, and the output module 707 are defined as either software, firmware, hardware, or a combination thereof. In this regard, it should be understood that software refers to program instructions that are stored on a computer readable medium and that are capable of being executed by a computer to perform a prescribed function. Also in this regard, it should be understood that firmware refers to circuitry that is defined to operate in a specific manner to perform a prescribed function. For example, firmware may correspond to circuitry for implementing a state machine that is defined to perform one or more prescribed functions. Furthermore, it should be understood that hardware refers to physical equipment defined perform a particular function. For example, hardware may refer to one or more components of a computing system, such as a central processing unit, a memory, an input/output module, a hard drive, etc. Additionally, hardware within the context of the system of FIG. 7 may include essentially any type of PCT processing equipment, such as optical imaging devices by way of example.

The invention described herein can be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion. Additionally, a graphical user interface (GUI) implemented as computer readable code on a computer readable medium can be developed to provide a user interface for performing any embodiment of the present invention.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for accelerating process compensation technique (PCT) processing of a semiconductor chip layout, comprising:
    operating a computer to replace selected cells in the semiconductor chip layout with corresponding PCT pre-processed cells, wherein each PCT pre-processed cell represents a particular selected cell having been previously subjected to a cell-level-PCT-processing operation so as to include PCT-based cell layout adjustments, wherein the cell-level-PCT processing operation of a given cell includes generation of at least one as-fabricated aerial image of one or more PCT processed levels of the given cell and evaluation of PCT processing adequacy based on the at least one as-fabricated aerial image;
    following replacement of the selected cells in the semiconductor chip layout with corresponding PCT pre-processed cells, operating a computer to perform a chip-wide PCT processing operation on the semiconductor chip layout for a given chip level; and
    operating a computer to record the chip-wide PCT processed semiconductor layout for the given chip level on a computer readable storage medium.

2. A method as recited in claim 1, wherein the chip-wide PCT processing operation on the semiconductor chip layout for the given chip level is perfoined without PCT processing of the PCT pre-processed cells present within the semiconductor chip layout.

3. A method as recited in claim 1, wherein the chip-wide PCT processing operation on the semiconductor chip layout for the given chip level includes PCT processing of the PCT pre-processed cells present within the semiconductor chip layout.

4. A method as recited in claim 3, wherein the chip-wide PCT processing of a given PCT pre-processed cell considers the PCT-based cell layout adjustments already present in the given PCT pre-processed cell.

5. A method as recited in claim 1, further comprising:
    specifying one or more PCT pre-processed cells in the semiconductor chip layout for PCT processing during the chip-wide PCT processing operation; and
    PCT processing the one or more specified PCT pre-processed cells in the semiconductor chip layout during the chip-wide PCT processing operation, wherein non-specified PCT pre-processed cells in the semiconductor chip layout are not subjected to PCT processing during the chip-wide PCT processing operation.

6. A method as recited in claim 1, wherein the selected cells in the semiconductor chip layout that are replaced by corresponding PCT pre-processed cells are standard cells.

7. A method as recited in claim 1, wherein the selected cells in the semiconductor chip layout that are replaced by corresponding PCT pre-processed cells are non-memory cells.

8. A method as recited in claim 1, wherein the persistent storage medium is a computer readable medium.

9. A method as recited in claim 1, wherein both the cell-level-PCT-processing operation and the chip-wide PCT processing operation include an optical proximity correction (OPC) processing operation.

10. A method as recited in claim 1, wherein both the cell-level-PCT-processing operation and the chip-wide PCT processing operation include both an optical proximity correction (OPC) processing operation and a mask proximity correction (MPC) operation.

11. A method for processing a semiconductor chip layout for fabrication, comprising:
 a) obtaining a chip layout having a number of cells placed in a section of the chip layout to form a prescribed integrated circuit;
 b) operating a computer to replace one or more of the number of placed cells with a corresponding process compensation technique (PCT) pre-processed cell, wherein a given PCT pre-processed cell represents a particular placed cell having been previously subjected to a cell-level-PCT-processing operation so as to include PCT-based cell layout adjustments within the given PCT pre-processed cell, wherein the cell-level-PCT processing operation of a given cell includes generation of at least one as-fabricated aerial image of one or more PCT processed levels of the given cell and evaluation of PCT processing adequacy based on the at least one as-fabricated aerial image;
 c) operating a computer to perform a chip-wide PCT processing operation on a given level of the chip layout to generate a chip-wide PCT processed chip layout for the given level;
 d) operating a computer to record the chip-wide PCT processed chip layout for the given level on a computer readable storage medium; and
 e) repeating operations c) and d) for each level of the chip that requires PCT processing for fabrication.

12. A method as recited in claim 11, wherein both the cell-level-PCT-processing operation and the chip-wide PCT processing operation include an optical proximity correction (OPC) processing operation.

13. A method as recited in claim 11, wherein both the cell-level-PCT-processing operation and the chip-wide PCT processing operation include both an optical proximity correction (OPC) processing operation and a mask proximity correction (MPC) operation.

14. A method as recited in claim 11, wherein the number of cells placed in the section of the chip layout to form the prescribed integrated circuit are standard cells.

15. A method as recited in claim 11, wherein the number of cells placed in the section of the chip layout to form the prescribed integrated circuit are non-memory cells.

16. A method as recited in claim 11, wherein the chip-wide PCT processed chip layout is recorded in a digital format on a computer readable storage medium.

17. A method as recited in claim 11, wherein the operations a) through e) are performed by computer executable program instructions stored on a computer readable medium and executed by a computer.

18. A method as recited in claim 11, wherein the chip-wide PCT processing of operation c) is performed without PCT processing of the PCT pre-processed cells within the chip layout.

19. A method as recited in claim 11, wherein the chip-wide PCT processing of operation c) includes PCT processing of the PCT pre-processed cells within the chip layout, and wherein the PCT processing of a given PCT pre-processed cell within the chip layout begins with the PCT-based cell layout adjustments present within the given PCT pre-processed cell.

20. A method as recited in claim 11, further comprising:
 prior to operation c), specifying one or more PCT pre-processed cells in the chip layout for PCT processing during the chip-wide PCT processing of operation c); and
 during operation c), PCT processing the one or more specified PCT pre-processed cells in the chip layout, wherein the PCT processing of a given PCT pre-processed cell within the chip layout begins with the PCT-based cell layout adjustments present within the given PCT pre-processed cell, and wherein non-specified PCT pre-processed cells in the chip layout are not subjected to PCT processing during the chip-wide PCT processing of operation c).

21. A process compensation technique (PCT) processing system, comprising:
 an input module defined to receive a chip layout for PCT processing, wherein the chip layout includes a number of cells placed in a section of the chip layout to form a prescribed integrated circuit;
 a cell substitution module defined to replace one or more of the number of cells in the chip layout with a corresponding PCT pre-processed cell, wherein a given PCT pre-processed cell represents a particular cell having been previously subjected to a cell-level-PCT-processing operation so as to include PCT-based cell layout adjustments within the given PCT pre-processed cell, wherein the cell-level-PCT processing operation of a given cell includes generation of at least one as-fabricated aerial image of one or more PCT processed levels of the given cell and evaluation of PCT processing adequacy based on the at least one as-fabricated aerial image;
 a PCT processing module defined to perform a chip-wide PCT processing operation on specified levels of the chip layout to generate a chip-wide PCT processed chip layout for each of the specified levels of the chip layout; and
 an output module defined to record the chip-wide PCT processed chip layout for each of the specified levels of the chip layout on a persistent storage medium.

22. A system as recited in claim 21, wherein the PCT processing module is defined to perform the chip-wide PCT processing operation without PCT processing of the PCT pre-processed cells within the chip layout.

23. A system as recited in claim 21, wherein the PCT processing module is defined to PCT process the PCT pre-processed cells within the chip layout during the chip-wide PCT processing operation, and wherein the PCT processing of a given PCT pre-processed cell within the chip layout begins with the PCT-based cell layout adjustments present within the given PCT pre-processed cell.

24. A system as recited in claim 21, wherein the PCT processing module is defined to PCT process tagged PCT pre-processed cells during the chip-wide PCT processing operation, and wherein the PCT processing of a given tagged PCT pre-processed cell within the chip layout begins with the PCT-based cell layout adjustments present within the given tagged PCT pre-processed cell, and wherein during the chip-wide PCT processing operation the PCT processing module is defined to skip PCT processing of non-tagged PCT pre-processed cells in the chip layout.

25. A system as recited in claim 21, further comprising:

a cell library accessible by the cell substitution module, wherein the cell library includes PCT pre-processed cells for use by the cell substitution module in replacing one or more of the number of cells in the chip layout.

26. A system as recited in claim 21, wherein the input module, the cell substitution module, the PCT processing module, and the output module are defined as either software, firmware, hardware, or a combination thereof.

27. A system as recited in claim 21, wherein both the cell-level-PCT-processing operation and the chip-wide PCT processing operation include an optical proximity correction (OPC) processing operation.

28. A system as recited in claim 21, wherein both the cell-level-PCT-processing operation and the chip-wide PCT processing operation include both an optical proximity correction (OPC) processing operation and a mask proximity correction (MPC) operation.

29. A system as recited in claim 21, wherein the chip-wide PCT processed chip layout is recorded in a digital format on a computer readable storage medium.

* * * * *